(12) United States Patent
Koike et al.

(10) Patent No.: US 8,089,158 B2
(45) Date of Patent: Jan. 3, 2012

(54) LIQUID CRYSTAL DISPLAY DEVICE AND MANUFACTURING METHOD THEREFOR

(75) Inventors: Junichi Koike, Sendai (JP); Hideaki Kawakami, Chiba (JP)

(73) Assignee: Advanced Interconnect Materials, LLC, Sendai (JP)

( * ) Notice: Subject to any disclaimer, the term of this patent is extended or adjusted under 35 U.S.C. 154(b) by 245 days.

(21) Appl. No.: 12/455,161

(22) Filed: May 29, 2009

(65) Prior Publication Data

US 2009/0290116 A1  Nov. 26, 2009

Related U.S. Application Data

(63) Continuation of application No. 11/784,879, filed on Apr. 10, 2007, now Pat. No. 7,633,164.

(51) Int. Cl.
*H01L 23/48* (2006.01)

(52) U.S. Cl. .............. 257/762; 257/59; 257/72; 257/83; 257/E33.062

(58) Field of Classification Search .................... 257/59, 257/72, 83, 762
See application file for complete search history.

(56) References Cited

U.S. PATENT DOCUMENTS

| 4,719,134 | A  | * | 1/1988  | Ely ................................ 428/1.4 |
| 7,507,666 | B2 | * | 3/2009  | Nakao et al. ................... 438/687 |
| 2005/0094045 | A1 | * | 5/2005  | Chae ............................... 349/40 |
| 2006/0275618 | A1 |   | 12/2006 | Kugimiya et al. |

FOREIGN PATENT DOCUMENTS

| JP | 10-153788 | 6/1998 |
| JP | 2000-199054 | 7/2000 |
| JP | 2002-069550 | 3/2002 |
| JP | 2004-091907 | 3/2004 |
| JP | 2004-139057 | 5/2004 |
| JP | 2004-163901 | 6/2004 |
| JP | 2005-158887 | 6/2005 |
| JP | 2005-166757 | 6/2005 |
| JP | 2005-277390 | 10/2005 |
| JP | 2007-012996 | 1/2007 |
| JP | 2007-017926 | 1/2007 |
| JP | 2007-067107 | 3/2007 |
| JP | 2007-072428 | 3/2007 |
| JP | 2007-081113 | 3/2007 |
| WO | WO 2006/025347 A1 | 3/2006 |
| WO | 2007/018052 A1 | 2/2007 |

\* cited by examiner

*Primary Examiner* — Wai Sing Louie

(74) *Attorney, Agent, or Firm* — Masuvalley and Partners

(57) ABSTRACT

The present invention includes a liquid crystal display device having an oxide film having high adhesiveness to a substrate to thereby prevent oxidation of a wiring material or the like, and includes, an electrode or a terminal electrode having high conductivity, and a manufacturing method therefor. Consequently, in the present invention, a liquid crystal display device has an electrode terminal of a TFT substrate, wherein the electrode is formed on an insulator and is comprised of a conductive layer mainly consisting of copper and an oxide covering an outer part, further the oxide is a layered structure of transparent electrodes, the layered portion having ohmic contact, and the oxide mainly consists of manganese oxide.

16 Claims, 42 Drawing Sheets

I-V characteristics after heat treatment at 150°C for 30 minutes

I-V characteristics after heat treatment at 150°C for 30 minutes

I-V characteristics after heat treatment at 200°C for 30 minutes

I-V characteristics after heat treatment at 200°C for 30 minutes

I-V characteristics after heat treatment at 250°C for 30 minutes

I-V characteristics after heat treatment at 250°C for 30 minutes

I-V characteristics after heat treatment at 300°C for 30 minutes

I-V characteristics after heat treatment at 300°C for 30 minutes

Change in contact resistance
by thermal treatment temperature

| Temperature (°C) | $\rho$ ($\Omega cm^2$) |
|---:|---:|
| 0 | 0.0299 |
| 150 | 0.0598 |
| 200 | 0.0640 |
| 250 | 0.0688 |
| 350 | 0.0694 |

Load value required for interface peeling is measured by nano scratch method. Even changing scratch time (speed), a larger load is required to peel Cu-Mn.

(Cross-section of gate wiring)

LIQUID CRYSTAL DISPLAY DEVICE AND MANUFACTURING METHOD THEREFOR

This application claims priority under 35 U.S.C. §120 as a continuation of U.S. patent application Ser. No. 11/784,879, filed Apr. 10, 2007, entitled "LIQUID CRYSTAL DISPLAY DEVICE AND MANUFACTURING METHOD THEREFOR."

TECHNICAL FIELD

The present invention relates to a liquid crystal display device provided with wiring mainly consisting of copper (Cu) covered with an oxide film containing Mn (Mn-containing oxide film) and to a manufacturing method therefor. More particularly to an external extraction electrode terminal structure used in the liquid crystal display device, specially to a liquid crystal display device provided with the external extraction electrode terminal structure covered with an oxide and to a manufacturing method therefore.

BACKGROUND OF INVENTION

In recent years, a low-power-consumption liquid crystal display device (LCD) that is thin, lightweight, and capable of being driven by lower voltage has been widely used. In such a liquid crystal display device, a screen size has been increasing year after year and a display of moving images just like TV images has been required. To meet such requirements, wiring should be configured with a low-resistive and high-conductive material.

Along with such increase in the screen size of the liquid crystal display device, a gate wiring material has been changed from molybdenum alloy to aluminum alloy or aluminum clad. However, aluminum (Al) has problems of hillock and electromigration.

For example, as disclosed in Patent Document 1, Japanese published unexamined patent application No. 2000-199054, a wiring material consisting of Al—Nd alloy has been proposed, and anodized Al, Mo-alloy-cladded Al, or double-layered Al has been used. The Al—Nd alloy has a resistivity of 5.1 $\mu\Omega$·cm while pure Al has a resistivity of 2.5 $\mu\Omega$·cm.

Therefore, in order to use pure Al in practice, wiring having a three-layered structure of Ti/Al/Ti or Mo/Al/Mo is used as measures for the hillock and electromigration. However, this causes an increase in film formation steps, which remains as a problem.

On the other hand, copper has drawn attention as a material having resistivity lower than those of the above-described gate electrode materials. However, copper has problems of not only poor adhesiveness to glass used as a TFT substrate in an LCD, but also of being easily oxidized when an insulation layer is formed.

For this reason, a technique using alloyed copper wiring has recently been attempted in a TFT-LCD in order to solve such problems. This technique is intended to make an alloying element form reaction products with a substrate to thereby ensure adhesiveness to the substrate as well as to make an additive element form oxide on the Cu surface to thereby make the oxide act as an oxidation resistant film for Cu.

However, with this proposed technique, intended characteristics have not been adequately developed. That is, electrical resistance of Cu becomes higher because the alloying element remains in Cu, and therefore advantages over wiring materials using Al or Al alloy have not been able to be exhibited.

Further, as described in Patent Document 2, Japanese published unexamined patent application No. 2004-163901, in order to use the copper wiring for a TFT-LCD, a technique to ensure adhesiveness and barrier characteristics to a substrate by the formation of a Mo alloy film between Cu and the substrate has been considered.

However, this technique has problems of an increase in process steps, i.e., a step of forming the Mo alloy film, as well as of an increase in wiring effective resistance. Further, a Cu single layer is used for source and drain electrodes, however, there remains a problem in its stability.

Also in Patent Document 3, Japanese published unexamined patent application No. 2004-139057, a technique in which a refractory nitride such as TaN, TiN, or WN is formed around Cu is proposed to solve such problems regarding the Cu wiring. However, compared with the conventional wiring materials, this technique has disadvantages of requiring another material to form a barrier layer and additional process steps, and of increasing effective resistance of wiring because a high-resistive barrier layer is thickly formed.

Further, Patent Document 4, Japanese published unexamined patent application No. 2005-166757 discloses a method for improving adhesiveness and oxidation resistance by the addition of one or more elements selected from Mg, Ti, or Cr to TFT-LCD wiring. However, this technique has a problem that the additive element remains in the wiring, causing an increase in wiring resistance. Also, the additive element reduces oxide in a substrate and the reduced element is diffused in the wiring, causing a problem of an increase in the wiring resistance.

Patent Document 5, Japanese published unexamined patent application No. 2002-69550 discloses a method for improving oxidation resistance by the addition of 0.3 to 10 wt. % of Ag to Cu. However, this technique has problems that adhesiveness to a glass substrate is not improved and oxidation resistance sufficient to resist liquid crystal processing cannot be obtained.

Patent Document 6, Japanese published unexamined patent application No. 2005-158887 proposes copper alloy prepared by the addition of 0.5 to 5 wt. % of at least one element of Ti, Mo, Ni, Al, or Ag to Cu to improve adhesiveness. However, there is a problem of an increase in electrical resistance of wiring due to the additive element.

Patent Document 7, Japanese published unexamined patent application No. 2004-91907, proposes a method for suppressing oxidation by the addition of 0.1 to 3.0 wt. % of Mo to Cu followed by the segregation of the added Mo at grain boundaries. However, although this technique is capable of improving oxidation resistance of Cu, it has a problem of an increase in wiring resistance.

In Patent Document 8, WO2006-025347, copper alloy prepared by the addition of an appropriate additive element to Cu is used, wherein the additive element forms an oxide film to become a passivation film, which suppresses oxidation of Cu, and the passivation film is also formed at an interface with an adjacent insulation layer, which suppresses interdiffusion. Consequently, copper wiring having high conductivity and superior adhesiveness to a substrate is provided. Further, a liquid crystal display device using such copper wiring is provided. In addition, it is suggested that one of such additive elements preferably be Mn.

In Patent Document 9, Japanese granted patent publication No. 3302894, a TFT structure used in TFT-LCD is proposed and a TFT structure, wherein a gate electrode coated with an oxide film when a Cu alloy is applied to the gate electrode, is specifically presented. In the document, it is presented that when Cu is a first metal, the second metal is at least one type chosen from Ti, Zr, Hf, Ta, Nb, Si, B, La, Nd, Sm, Eu, Gd, Dy, Y, Yb, Ce, Mg, Th, and Cr. However, the additive element of this second metal is different from that of the current invention. An external extraction electrode structure is not mentioned in any of these documents. However, high adhesiveness to a substrate, resistance to a use environment, and stability as an electrical contact of external extraction electrode are required to the external extraction electrode structure, and they are important components for a liquid crystal display device.

As described above, in these conventional techniques, an attempt to ensure adhesiveness to a substrate and oxidation resistance by the addition of an alloying additive element to Cu has been made, however, none of them has achieved a satisfactory result. Also, a satisfactory result has not been achieved regarding high adhesiveness to a substrate, resistance to a use environment, or stability as an electrical contact of external extraction electrode which are required to the external extraction electrode structure.

Especially, although Patent Document 8, WO2006-025347, suggests a liquid crystal display device using such copper wiring, the suggested technique alone is not able to provide a satisfactory configuration to realize a gate wiring structure to be used for the liquid crystal display device. Also, in the Patent Document 9, the oxide film for coating the gate electrode is specified as the oxide film mainly comprising the second metal formed by thermally treating in an oxygen ambient, however, it is not only unexplained but also not even indicated in the Patent Document 9 that the thermal treatment reacting Cu alloy and Si oxide film in contact with the Cu alloy, thereby forming oxide film of gate electrode, which ensures adhesiveness with a substrate. In addition, the external extraction electrode structure is not mentioned.

That is, all the difficulties in forming a Cu alloy film with less process steps, lowering effective resistance of wiring, and improving adhesiveness to a glass substrate must be solved, however, with the above conventional techniques, these difficulties cannot be solved, and product manufacturing is practically difficult.

The present invention has been made in consideration of such situations, and it is therefore objects of the present invention to form an oxide film having high adhesiveness to a substrate to thereby prevent oxidation of a wiring material or the like, and also to provide a liquid crystal display device provided with wiring, an electrode or a terminal electrode having high conductivity, and a manufacturing method therefor. Further, another object of the present invention is to form the wiring, electrode, or terminal electrode applicable to practical manufacturing processing while simultaneously accomplishing all the above objects.

BRIEF SUMMARY OF INVENTION

In order to accomplish the above objects, in an electrode terminal of a TFT substrate consisting of a liquid crystal display device, the electrode terminal formed on a insulator is comprised of a conductive layer mainly consisting of copper and an oxide covering the conductive layer mainly consisting of copper, further the oxide having a layered structure of transparent electrodes, and the layered portion is in ohmic contact.

The oxide may be an oxide layer containing Mn mainly and Cu subsidiarily.

Further, the oxide has compositional formula of $Cu_xMnYSi_zO$ ($0<X<Y$, $0<Z<Y$).

Also, the electrode terminal formed on an insulating layer is covered by a protective layer and the transparent electrode may be contacted to the oxide through an opening portion of the protective layer.

The oxide layer mainly comprised of copper is formed from a copper alloy, and an additive element in the copper alloy may be Mn.

An additive amount of Mn may be in a range of 0.5 to 25 atomic %.

The oxide layer may contain Cu and Si.

In order to accomplish the above objects as another invention, in an external extraction electrode terminal of a TFT substrate consisting of a liquid crystal display device, the electrode terminal formed on a insulator has a structure of being held between two different insulation layers or insulators, and the structure is comprised of a first layer mainly consisting of copper and a second layer consisting of an oxide covering an outer circumferential part of the first layer, further the second layer has a compositional formula of $Cu_xMnYSi_zO$ ($0<X<Y$, $0<Z<Y$).

This first layer is formed from a copper alloy, and an additive element of the copper alloy may be at least one type of metal selected from a group consisting of Mn, Zn, Ga, Li, Ge, Sr, Ag, In, Sn, Ba, Pr, and Nd.

Also the first layer is formed from a copper alloy, and an additive element in the copper alloy may be Mn.

Further, an additive amount of Mn may be in a range of 0.5 to 25 atomic %.

Also, the second layer may be an oxide layer containing Mn mainly and Cu subsidiarily.

The insulation layer or the insulation film holding the wiring or electrode in-between may contain glass.

The second layer may contain Cu and Si.

In order to accomplish the above objects as another invention, in an electrode terminal on a TFT substrate consisting of a liquid crystal display device, by thermally treating the copper alloy layer mainly comprising copper formed on a glass at approximately 150° C. to approximately 300° C., an additive element of said copper alloy may react with silicon oxide in the glass and form an oxide covering an outer circumferential part of said copper alloy layer.

Further, contact resistance may be configured to decrease after peaking at approximately 250° C. of the thermal treatment temperature for the copper alloy layer.

Film thickness of the oxide layer covering an outer circumferential part of the copper alloy layer may be 1 to 30 nm.

Further, in order to accomplish the above objects as another invention, in an external extraction electrode terminal of a TFT substrate consisting a liquid crystal display device, the electrode terminal formed on an insulator has a structure of being held between two different insulation layers or insulators, and the structure is comprised of a first layer mainly consisting of copper and a second layer consisting of an oxide covering an outer circumferential part of the first layer, further the second layer has a compositional formula of $Cu_xMnYSi_zO$ ($0<X<Y$, $0<Z<Y$).

This first layer is formed from a copper alloy, and an additive element of the copper alloy may be at least one type of metal selected from a group consisting of Mn, Zn, Ga, Li, Ge, Sr, Ag, In, Sn, Ba, Pr, and Nd.

This first layer is formed from a copper alloy, and an additive element in the copper alloy may be Mn.

An additive amount of Mn may be in a range of 0.5 to 25 atomic %.

DETAILED DESCRIPTION OF INVENTION

Embodiments of the present invention will hereinafter be described with reference to drawings. In the embodiments, a technique in which copper alloy of the present invention is applied to wiring constituting each electrode and a matrix of an a-Si TFT on a TFT substrate is described. First, a liquid crystal display device used for the present invention is described below.

Figure 1:
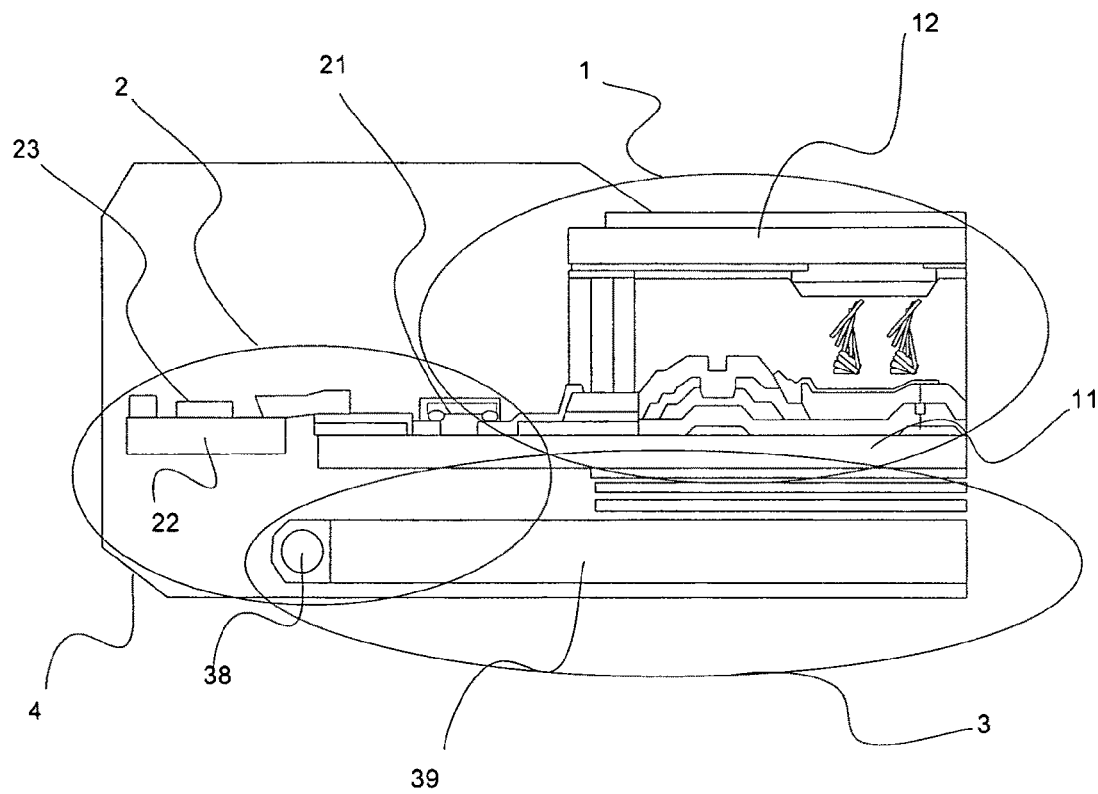
FIG. 1 is a conceptual diagram of a cross-section of a liquid crystal display (LCD) module.

FIG. 1 is a conceptual diagram illustrating a cross-section of a liquid crystal display (LCD) module. The display size of a liquid crystal display device has been increasing, and consequently an active matrix LCD is utilized. One representative of such LCDs is a TFT-LCD in which an LCD is driven by thin film transistors (TFTs). FIG. 1 represents such a TFT-LCD module. The TFT-LCD module is comprised of an LCD panel 1, a driving circuit 2, a backlight 3, and a chassis 4. The LCD panel 1 consists of a TFT substrate 11 and a color filter (CF) substrate 12, which are arranged on lower and upper sides respectively.

The driving circuit 2 serves to externally apply electrical signals to the LCD panel 1 to drive it. The driving circuit 2 is comprised of an LCD driver LSI chip 21 or an LCD driver LSI multilayered printed circuit board (PCB) 22, and a control circuit 23. The LCD driver LSI chip 21 or LCD driver LSI is electrically connected to terminal electrodes of the LCD panel through an anisotropic conductive film. To such a configuration, a backlight unit 38 and a light guide plate 39 are attached, and chassis 4 completes the module structure.

Figure 2:
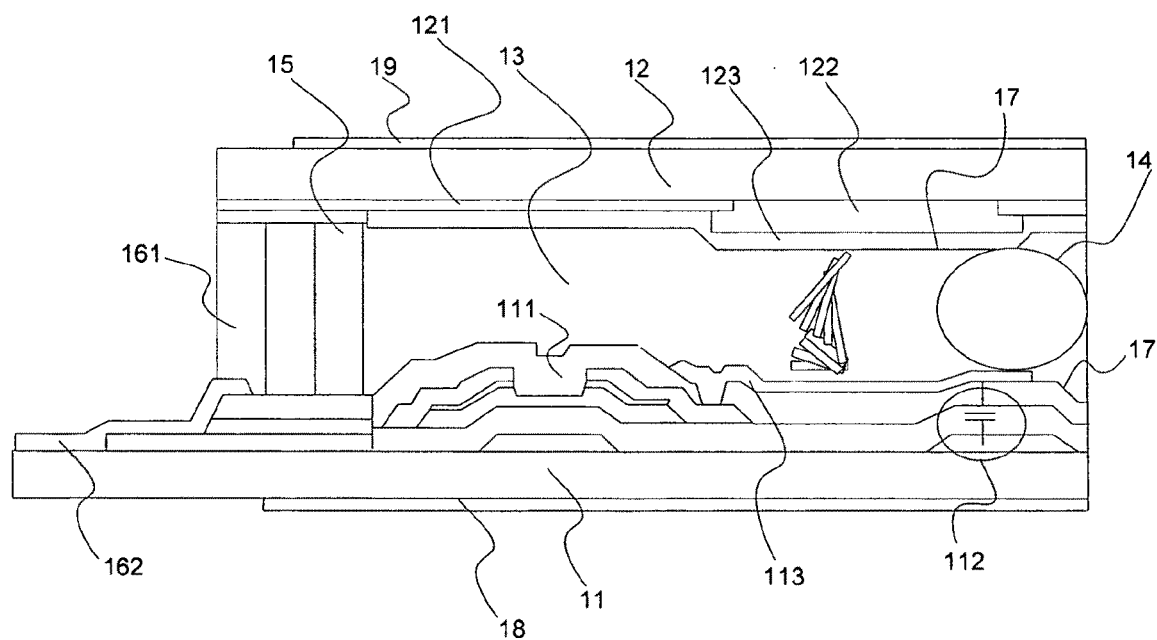
FIG. 2 is a conceptual diagram of a cross-section of an LCD panel.

FIG. 2 is a conceptual diagram illustrating a cross-section of the LCD panel 1. A liquid crystal layer (LC layer) 13 is formed in a space between the TFT substrate 11 and the CF substrate 12. A size of the space is approximately 3 to 5 μm and controlled by the arrangement of spacers 14 inside the panel. The liquid crystal layer is in a liquid state and sealed with surrounding sealing 15. In the liquid crystal layer, the arrangement of liquid crystal molecules is controlled so that they function as an optical crystal. The liquid crystal molecules are arranged vertically or horizontally with respect to interfaces that are inner faces of the substrates. This arrangement is called an orientation.

Oriented films 17 are coated onto the inner faces of the TFT substrate 11 and the CF substrate 12, i.e., on the liquid crystal layer sides. Further, polarizer films 18 and 19 are placed on the outer faces of the TFT substrate 11 and the CF substrate 12. On the TFT substrate 11, a TFT 111, a holding or a storage capacitor (Cs) 112, and a pixel electrode 113 are arranged. The combination of the TFT 111, the holding capacitor 112, and the pixel electrode 113 is a basic configuration of one pixel. Several million pixels are arranged in one LCD panel. Therefore, such pixels are connected in a matrix form through wiring on the TFT substrate 11.

Figure 3:
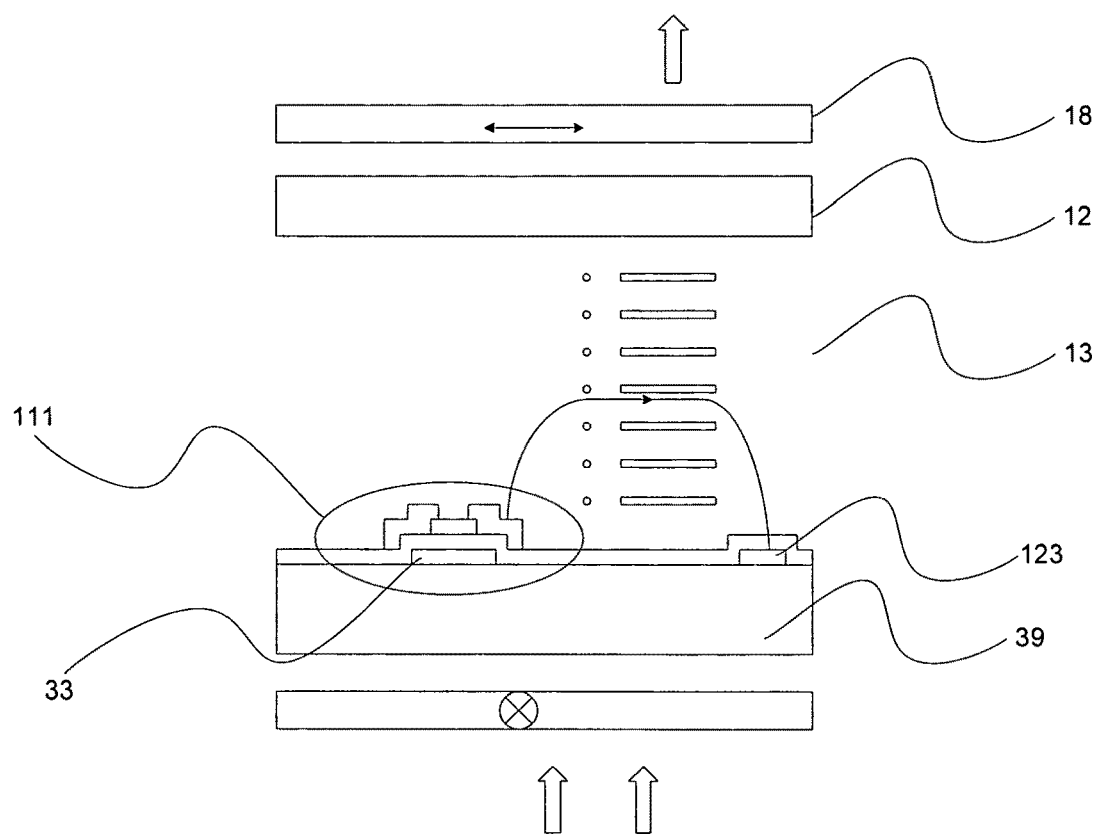
FIG. 3 is a conceptual diagram of an IPS liquid crystal.

The opposite CF substrate 12 is comprised of a black matrix (BM) 121, a color filter (CF) 122 consisting of three primary colors (red, green, and blue), and a common electrode 123. The common electrode 123 is typically placed on the CF substrate side, however, in an IPS liquid crystal (In-Plane Switching Nematic Liquid Crystal) mode, it is placed on the TFT substrate 11. A schematic diagram of the IPS liquid crystal is shown in FIG. 3.

In FIG. 2, the common electrode 123 is a transparent electrode, and uses indium tin oxide (ITO), indium zinc oxide (IZO) or indium tin zinc oxide (ITZO). In order to lead it outside, it is led to the TFT substrate 11 through a short part 161. Each electrode is electrically connected to the driving circuit 2 through a connection pad 162. Also, the TFT substrate 11 and the CF substrate 12 require transparency to light, and use hard glass. See U.S. Pat. No. 2,701,698 and U.S. Pat. No. 5,598,285 for more information on the IPS liquid crystal as shown in FIG. 3.

Figure 4:
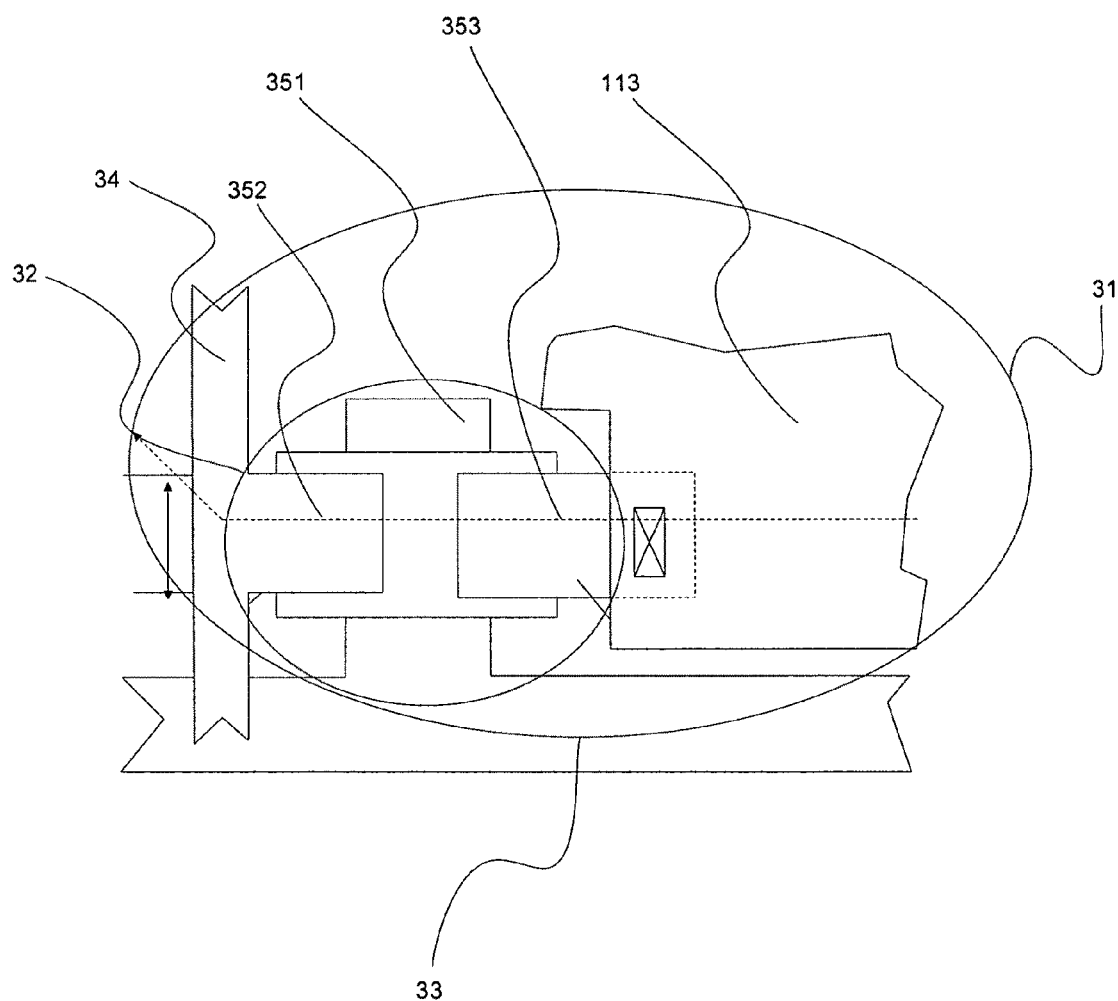
FIG. 4 is a plan view of a pixel part and a TFT part.
Figure 5:
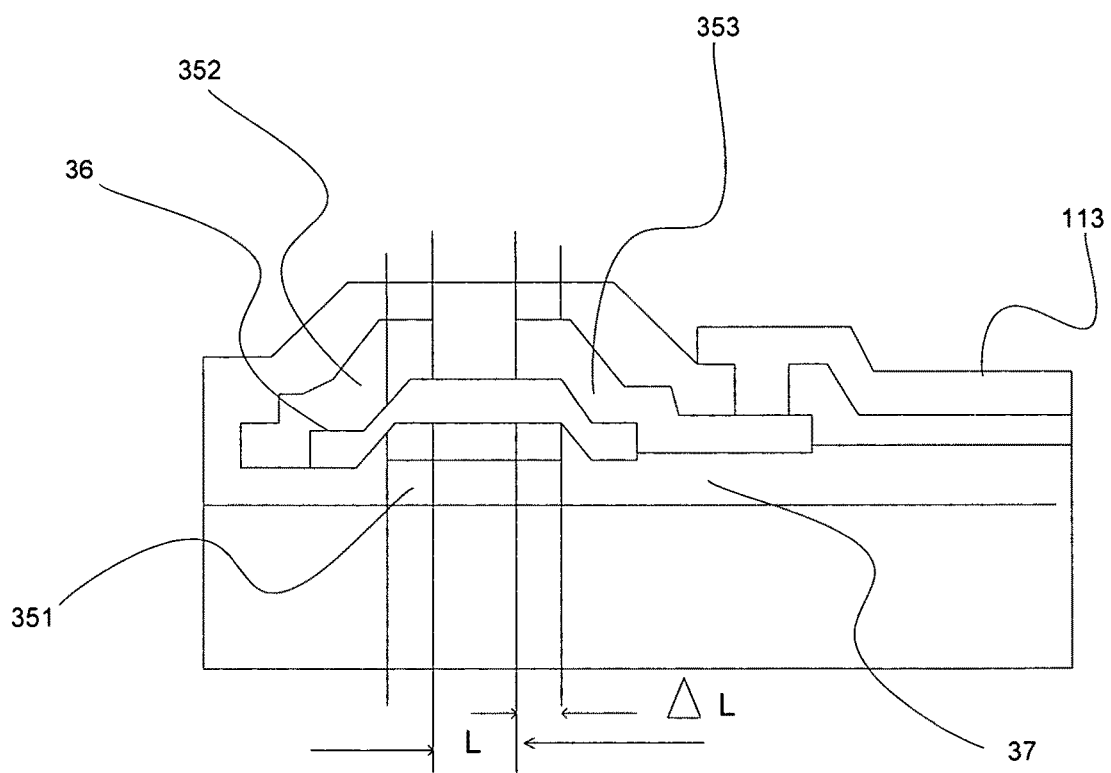
FIG. 5 is a cross-sectional view of a pixel part and a TFT part.
Figure 6:
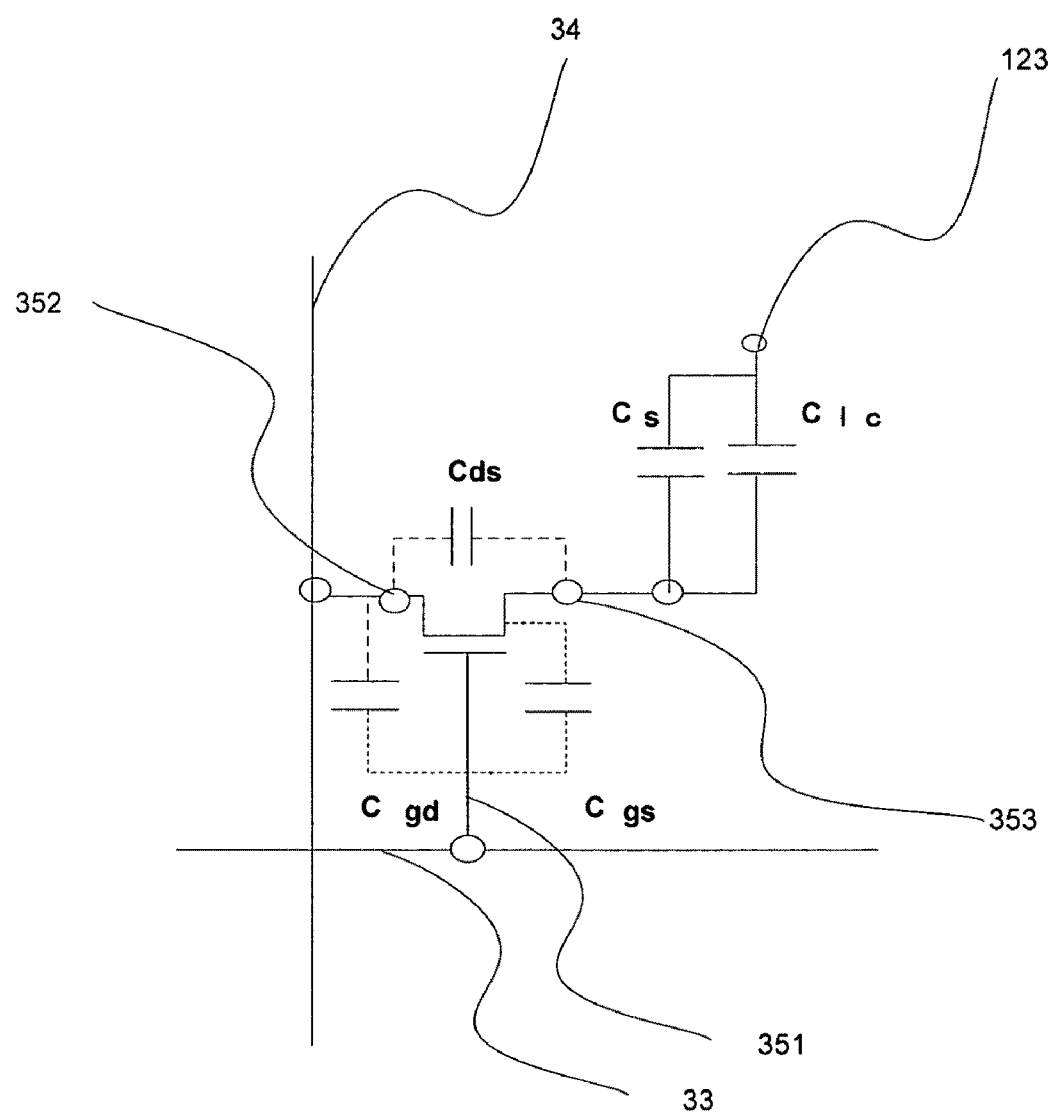
FIG. 6 is an equivalent circuit diagram of a pixel part and a TFT part.

FIG. 4 is a plan view, a cross-sectional view, and an equivalent circuit diagram of a pixel part 31 and a TFT part 32. Each pixel is connected to gate wiring 33 and signal wiring 34. Accordingly, as shown in the plan view of FIG. 4, the TFT part has three kinds of electrodes, i.e., a gate electrode 351, a source electrode 352, and a drain electrode 353. The drain electrode 353 is connected to the pixel electrode 113 via a through-hole As can be seen from a cross-sectional view in FIG. 5, amorphous silicon (a-Si) 36 is used as semiconductor, and silicon nitride $SiN_X$, a silicon oxide film $SiO_X$, a multilayered film of them, or an organic material layer is used as a gate insulation film 37. Expressing each pixel part as the equivalent circuit diagram (FIG. 6) results in the additions of parasitic capacitors $C_{gs}$, $C_{gd}$, and $C_{ds}$ between respective electrodes of the TFT. A liquid crystal layer is arranged between a pixel electrode 113 and a common electrode 123 on an opposite substrate, and expressed as $C_{lc}$ in the equivalent circuit diagram. Parallel to $C_{lc}$, a storage capacitor $C_s$ is formed.

Figure 7:
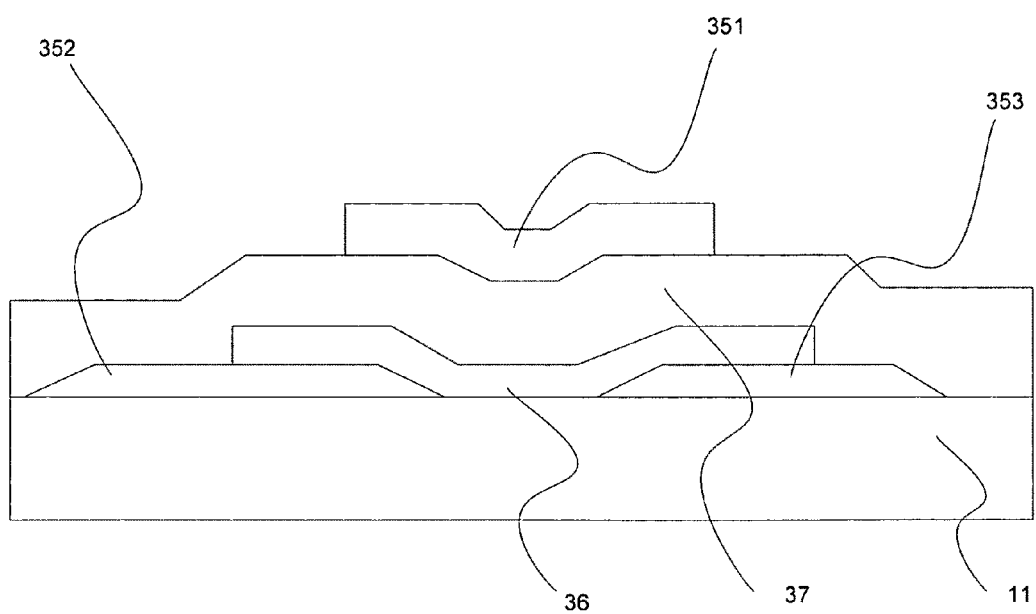
FIG. 7 is a cross-sectional view of a TFT (staggered top gate structure).
Figure 8:
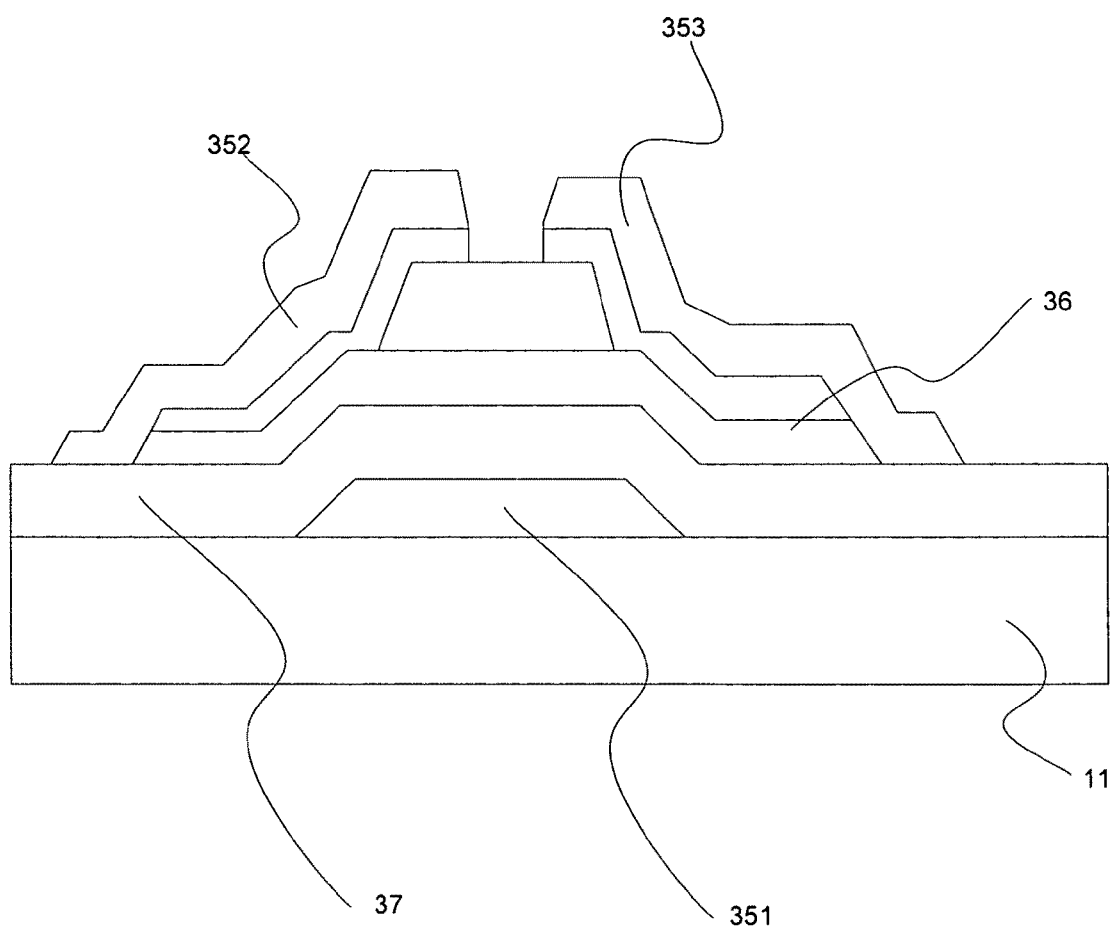
FIG. 8 is a cross-sectional view of a TFT (inversely staggered channel stopper structure).
Figure 9:
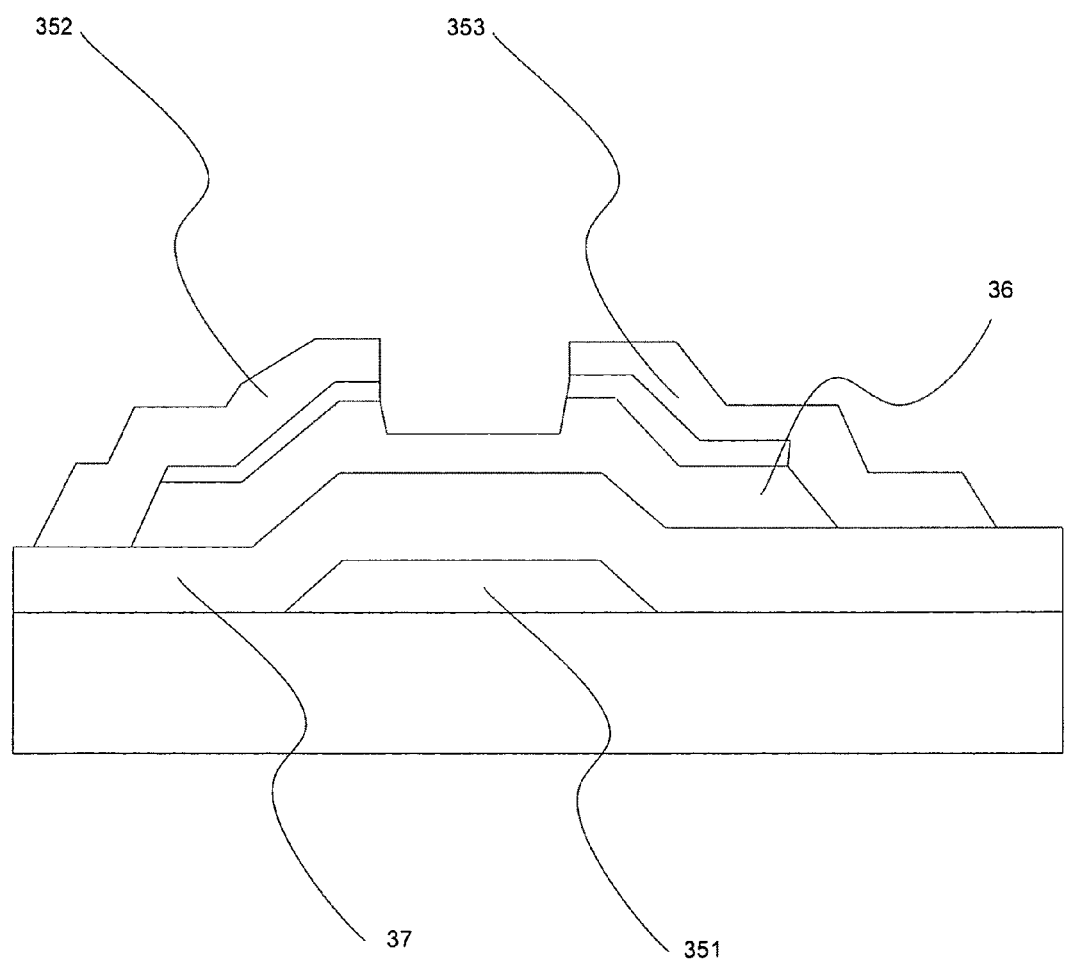
FIG. 9 is a cross-sectional view of a TFT (inversely staggered channel etch structure).

FIGS. 7, 8, and 9 show three kinds of a-Si TFT structures, i.e., a staggered top gate structure, an inversely staggered channel stopper structure, and an inversely staggered channel etch structure. Among them, the channel etch structure shown in FIG. 9 is often used in practice.

And, detail for applying this copper alloy to the electrode terminal for extracting outward, which connects the TFT-LCD panel and the driver LSI as a drive circuit, in the liquid crystal display device according to the present intervention is now explained. In the TFT-LCD of the liquid crystal display device according to the present invention, gate wiring using copper wiring typified by CuMn, and the electrode terminal 33 of the signal wiring comprise a structure that covers a wiring with the oxide product 47 by going through a production process as described later.

This oxide product 47 mainly consists of manganese oxide, and may include copper (Cu) or silicone. This enables stability to the atmosphere, and additionally, as for connectivity to the drive circuit, sufficient conductivity of the contact portion can be secured by a thermal compression bond or a voltage application because this oxide layer 47 has a thickness of a few nanometers (nm). Further, the oxide product is formed between the substrate which is an insulator, such as glass, and has a high adhesiveness with the substrate.

Figure 10:
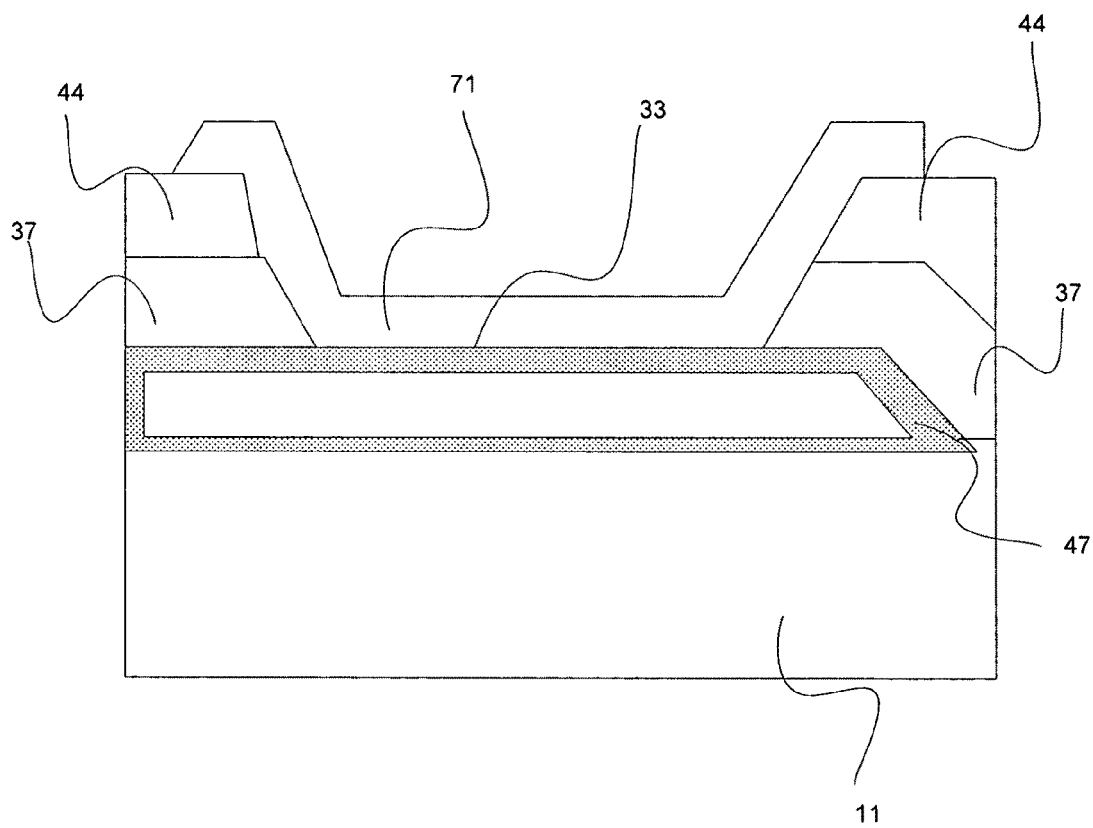
FIG. 10 is a cross-sectional view of a terminal portion of a liquid display device (LCD) module.
Figure 11:
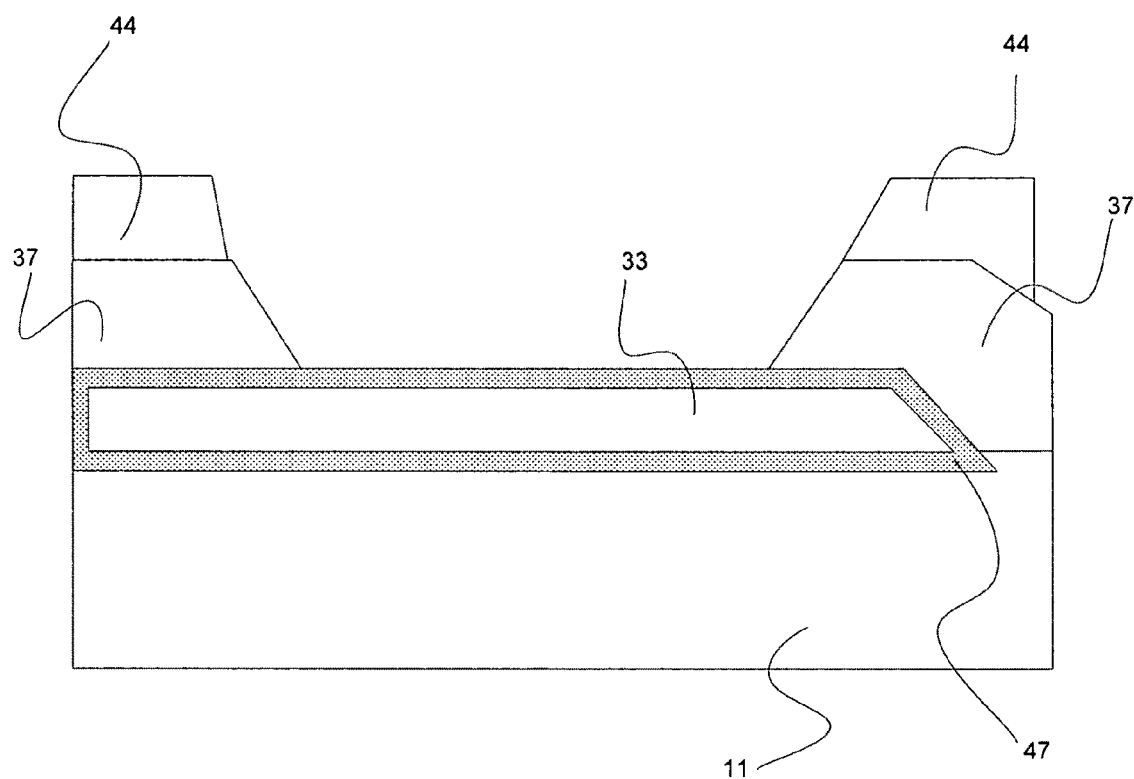
FIG. 11 is a cross-sectional view of a terminal portion of a liquid display device (LCD) module.
Figure 12:
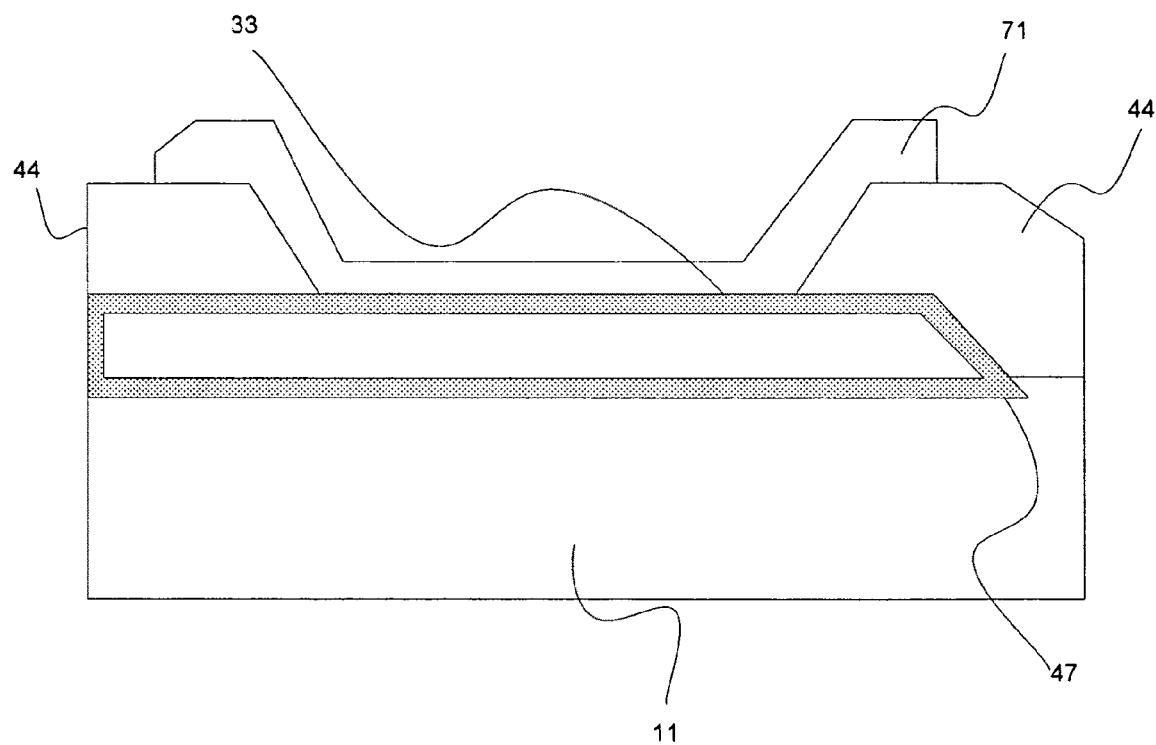
FIG. 12 is a cross-sectional view of a terminal portion of a liquid display device (LCD) module.

Such embodiments are shown in FIG. 10 to FIG. 19. Normally, a layer structure with ITO, IZO, or ITZO which is a transparent electrode 71, such as FIGS. 10 and 11, is employed to ensure environment resistance. The thickness of this oxide layer 47 is a few nm in this structure thereby adequate conductivity can be secured by a voltage application. In addition, by configuring as shown in FIG. 20 in the present invention, the current process can be used for the manufacturing method, thereby the present invention can be realized without significantly changing the manufacturing process.

Figure 13:
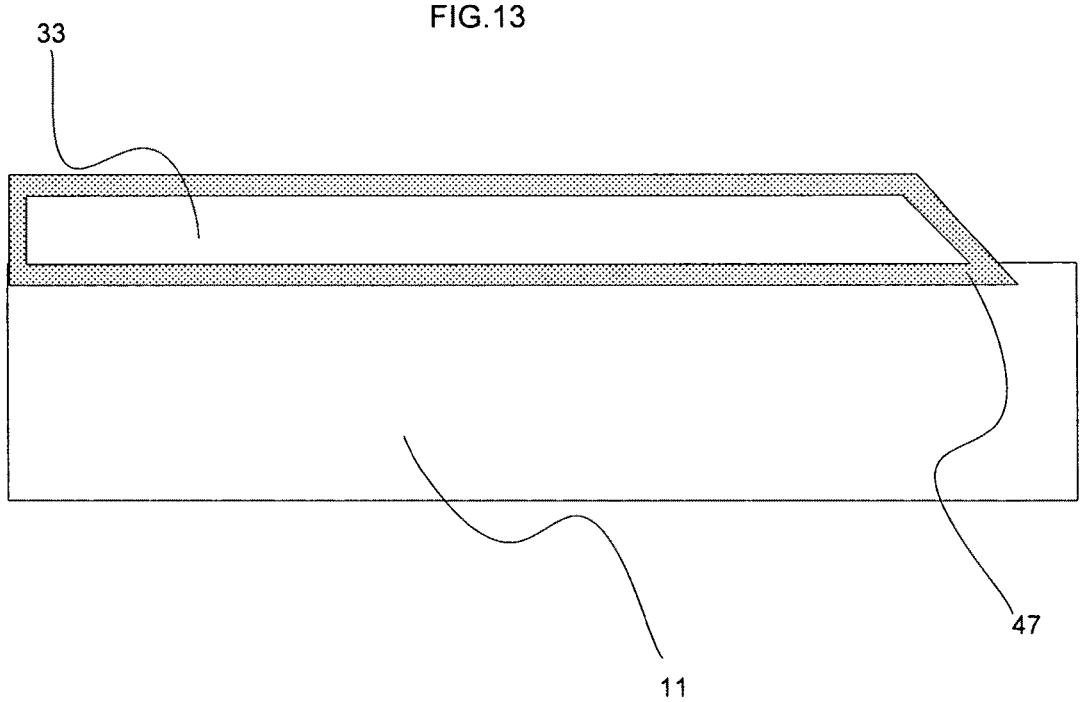
FIG. 13 is a cross-sectional view of a terminal portion of a liquid display device (LCD) module.
Figure 14:
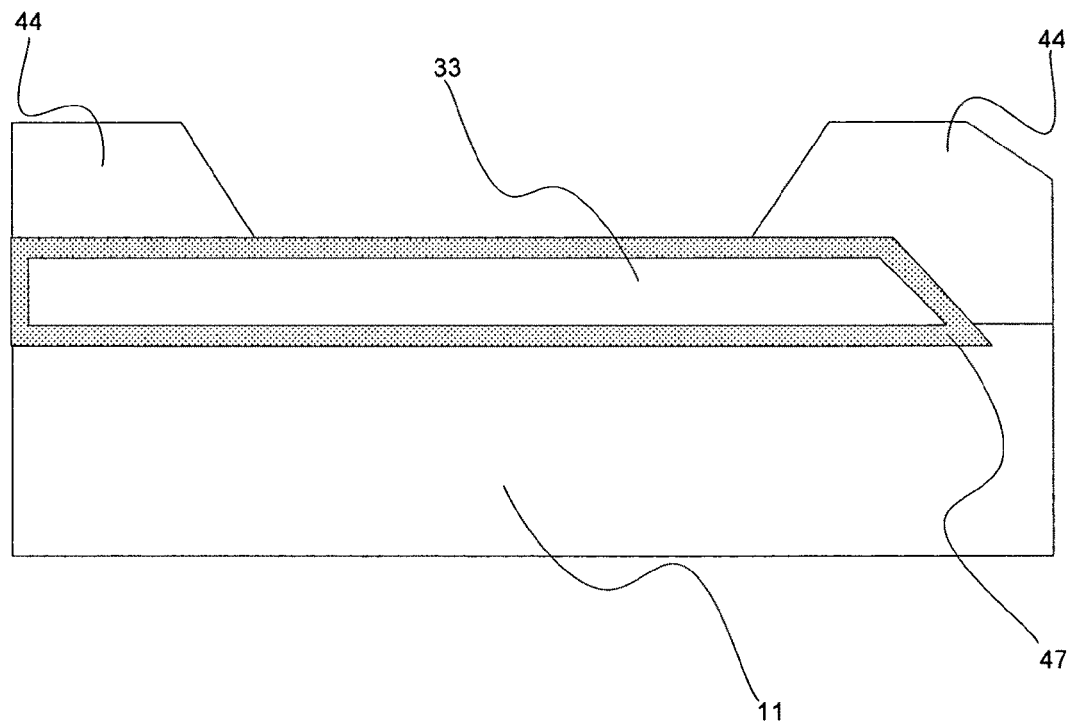
FIG. 14 is a cross-sectional view of a terminal portion of a liquid display device (LCD) module.

Further, this oxide product 47 prevents Cu from penetrating into the transparent electrode 71, thereby providing a terminal structure having a superior environmental resistance. Still further, as shown in FIGS. 11 and 13, the environmental resistance can be secured when a film pressure of this oxide layer is 10 nm to tens of nm, and the electrode terminal can be formed by a single layer of copper electrode. In this case, an electrical connection with an anisotropically-conductive film can be made by a thermal compression bond. Moreover, FIG. 14 shows a structure of an electrode that has a protective layer 44 removed.

[Ohmic Contact]

In the external extraction electrode structure, stability of electrical contact is required. Each contact portion is preferably to be in ohmic contact electrically. In the present invention, the external extraction electrode terminal mainly comprised of copper is covered by an oxide layer mainly comprised of manganese oxide. Although such thin oxide layer mediates, stable ohmic contact is shown. Such an experimental example is described below. The result of contact resistance is measured by the Transfer Length Method (TLM method). Cu-4atomic % Mn is formed on a transparent electrode (ITO) substrate in a thickness of 200 nm. Onto the substrate, placing a molybdenum mask with the opening diameter of 0.5 mm and the distance of an opening edge of 0.5 mm (distance between the center of the opening is 1 mm), then Cu—Mn is formed. Thereby, round electrodes are formed at equal intervals.

Figure 15:
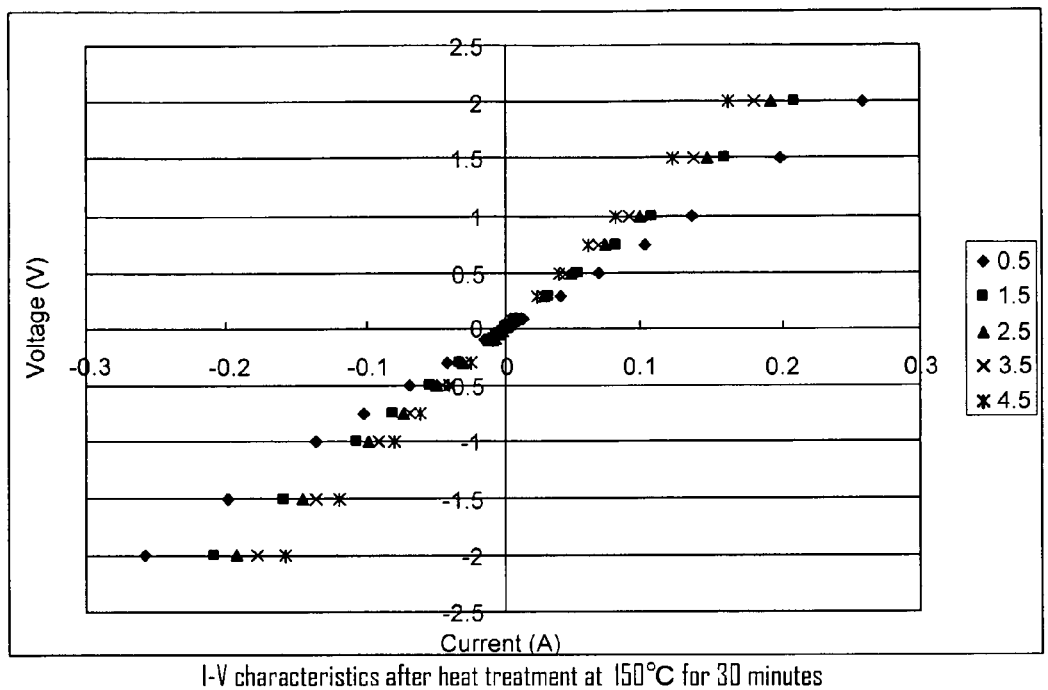
FIG. 15 is a measurement result of I-V characteristics.
Figure 15:
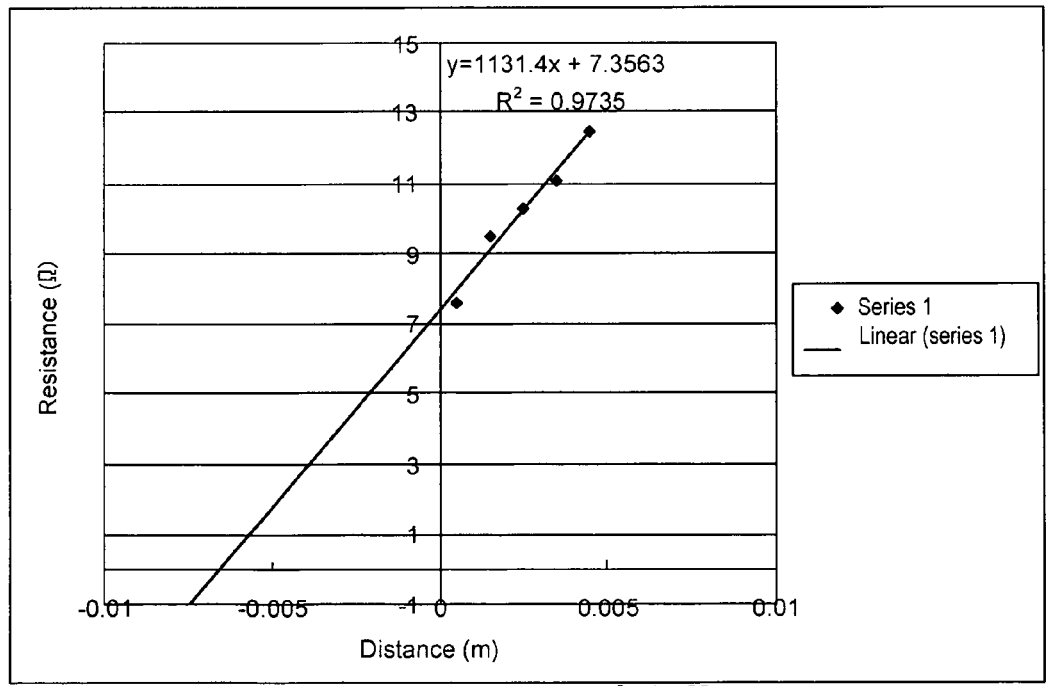
Figure 16:
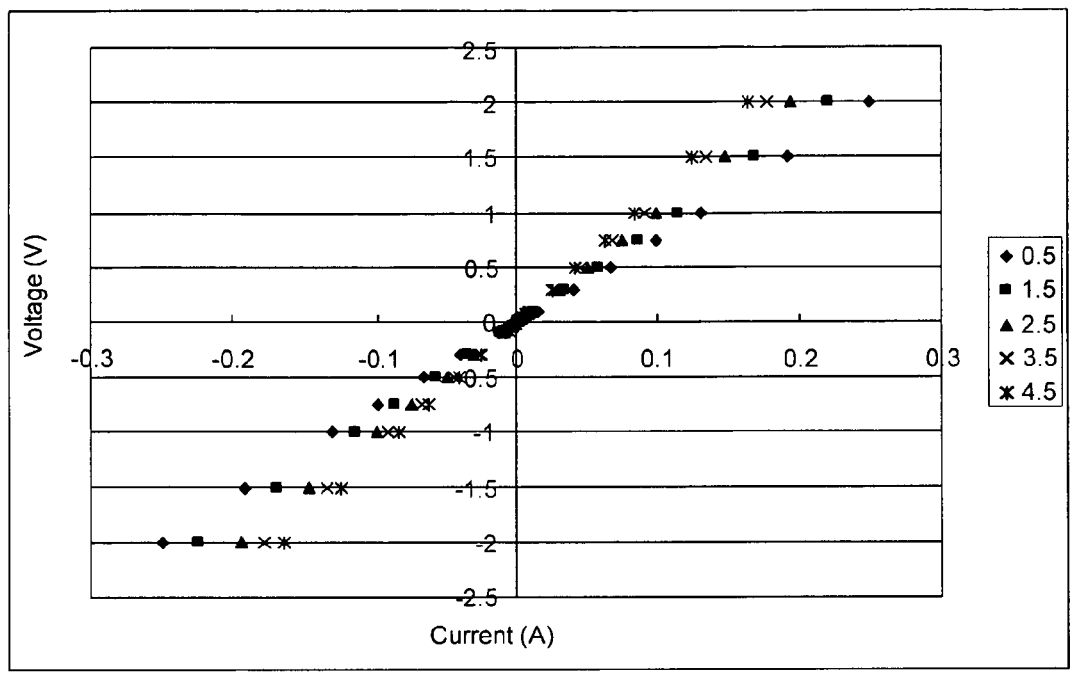
FIG. 16 is a measurement result of I-V characteristics.
Figure 16:
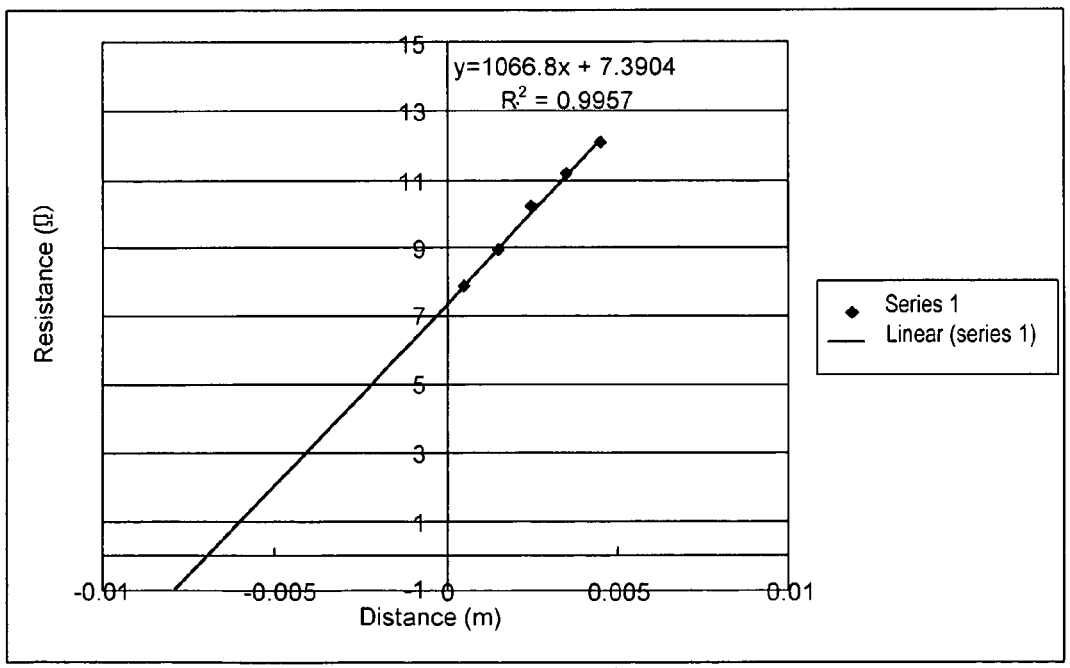
Figure 17:
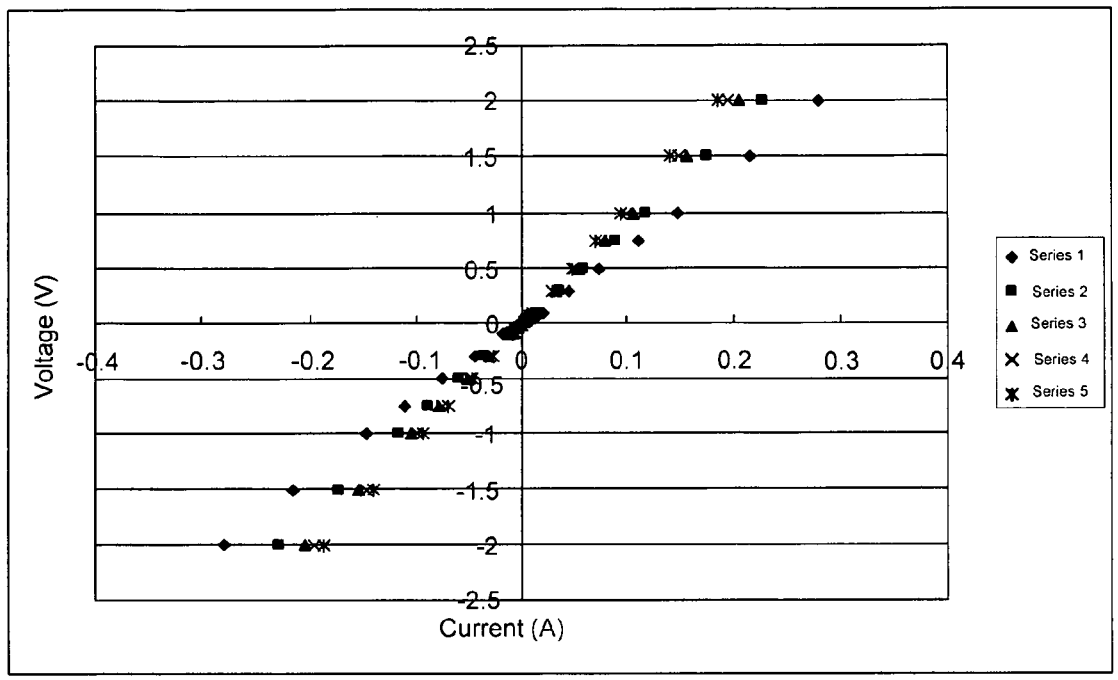
FIG. 17 is a measurement result of I-V characteristics.
Figure 17:
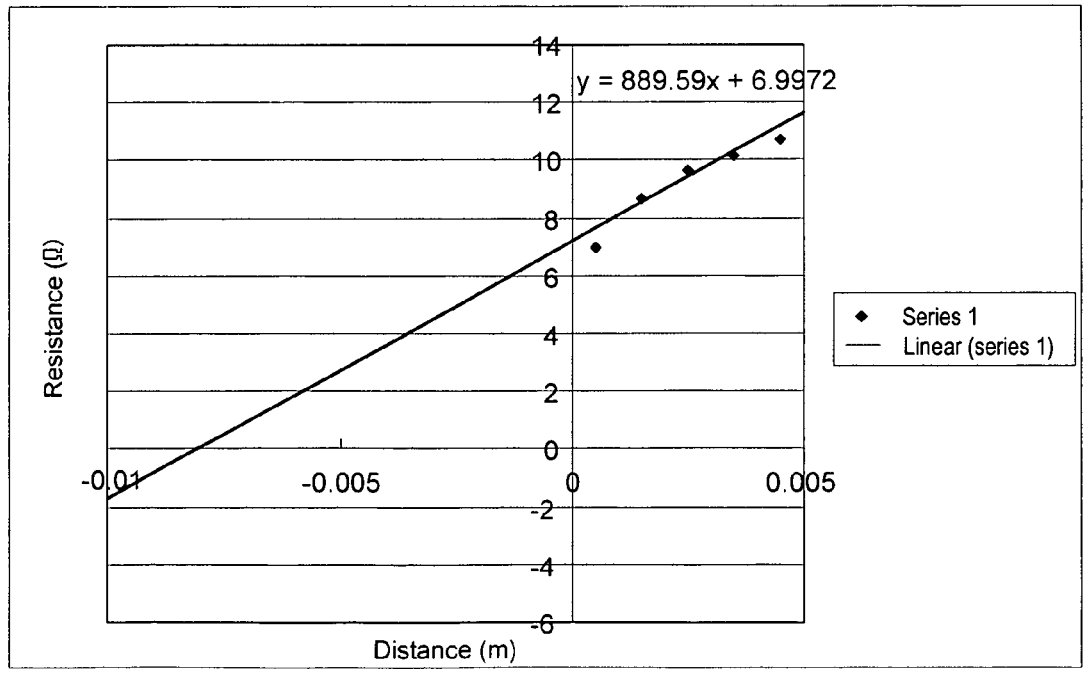
Figure 18:
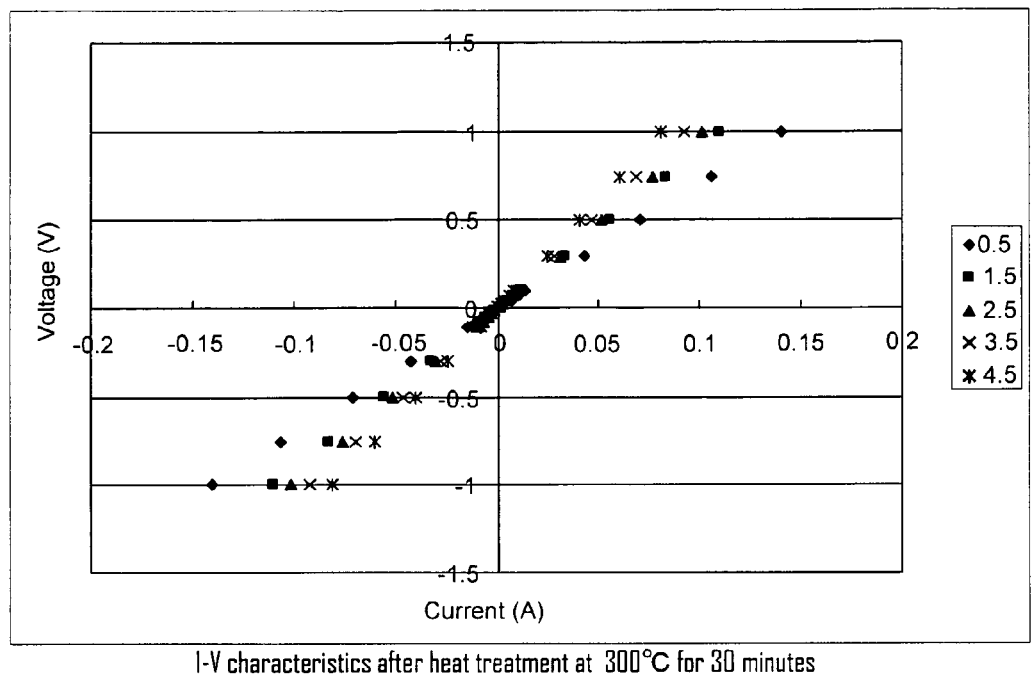
FIG. 18 is a measurement result of I-V characteristics.
Figure 18:
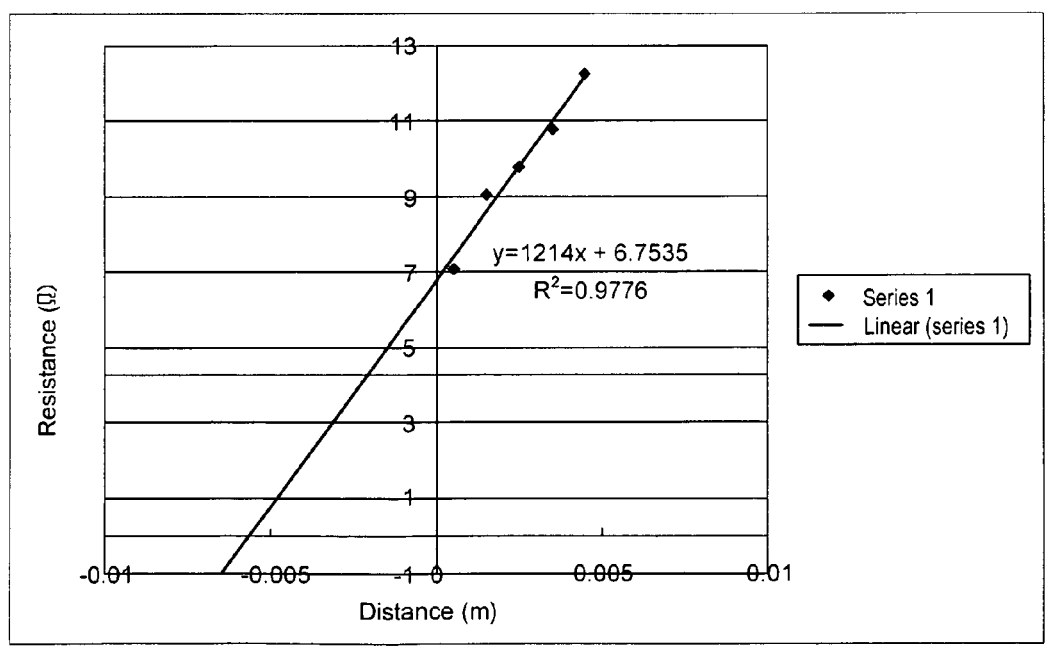

FIGS. 15 to 18 shows measurement results of I-V characteristics by contacting a prober to two different electrodes. The spacing between electrodes was changed to obtain the I-V characteristics. The contact resistance value was able to be obtained from these measurement results. In FIG. 15 to FIG. 18, I-V characteristics are showing linearity at each experiment parameter, thus demonstrating that ITO and CuMn are in ohmic contact. Results for the thermal treatment with various temperatures showing similar results and ohmic contacts are formed. At this time, FIG. 15 shows I-V characteristics when the thermal treatment temperature is 150° C. and the treatment time is 30 minutes. FIG. 16 shows I-V characteristics when the thermal treatment temperature is 200° C. and the treatment time is 30 minutes. FIG. 17 shows I-V characteristics when the thermal treatment temperature is 250° C. and the treatment time is 30 minutes. FIG. 18 shows I-V characteristics when the thermal treatment temperature is 300° C. and the treatment time is 30 minutes.

Figure 19:
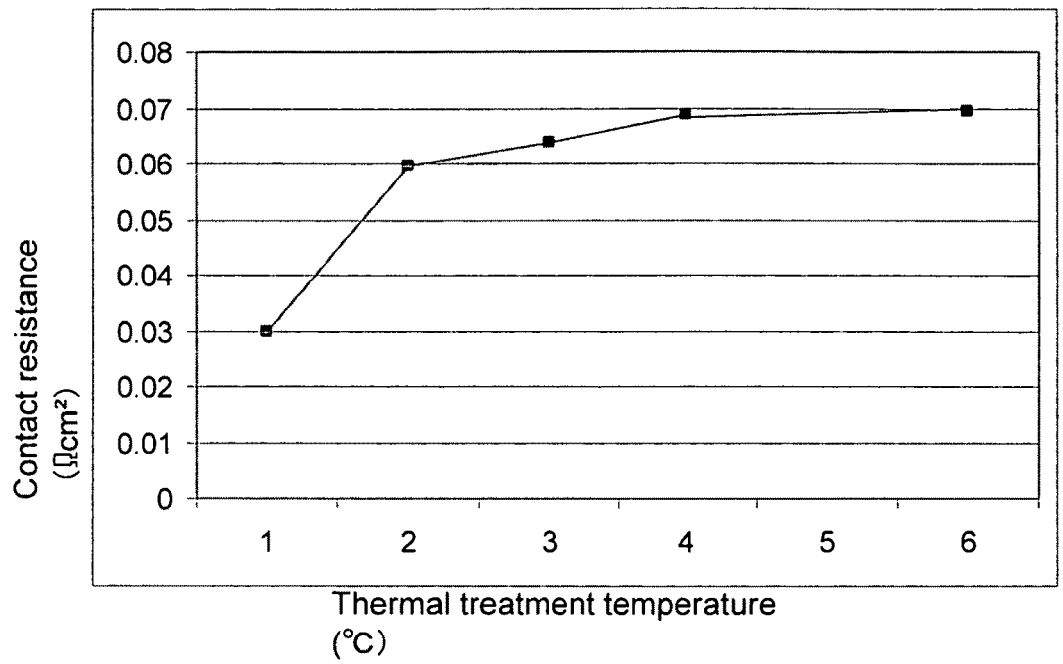
FIG. 19 is a measurement result of I-V characteristics.
Figure 20:
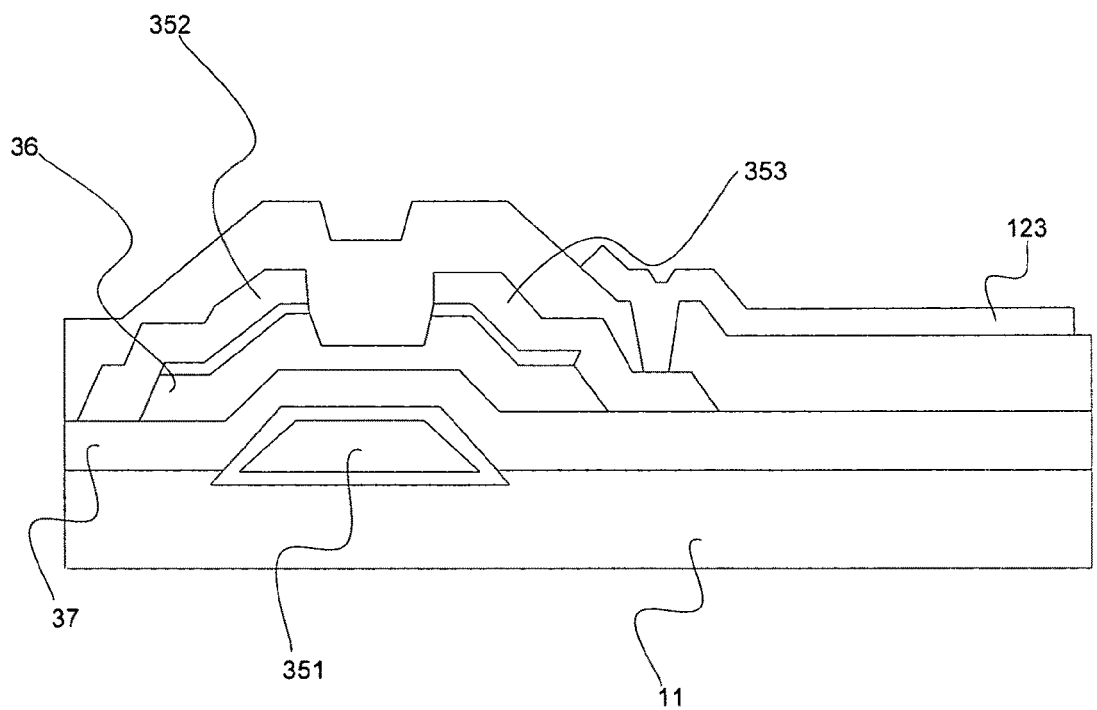
FIG. 20 is one example (1) of a cross-section of a pixel part and a TFT part of the present invention.

Regarding the results for heat treatment with these various temperatures, FIG. 19 plots the contact resistance in the vertical axis and the thermal treatment temperature in the transverse axis. As the heat treatment temperature rises, the value of contact resistance also increases because the thickness of the barrier layer increases. This result verifies that the layered portion of the electrode mainly comprised of copper, which has an oxide layer mainly comprised of manganese oxide mediated, and the transparent electrode is an ohmic contact. For this reason, this experiment result shows stability as an electrical contact, instead of the ohmic contact from the tunnel effect that we initially anticipated. In FIG. 19, when the thermal treatment temperature exceeds 250° C., the contact resistance value virtually saturates. For this reasons, a terminal with an appropriate contact resistance value can be formed during normal manufacturing processes of liquid crystal display devices without providing a special thermal treatment process.

Also, the oxide layer mainly comprised of Mn oxide has a thickness of a few nm, thus an application of voltage may cause a dielectric breakdown and leads to conductivity. However, slight instability remains in this conductivity that causes dielectric breakdown. From the experiment results of the present invention, which demonstrates that the contact with ITO which mediates the oxide layer, and CuMn is ohmic, instead of the contact that causes such dielectric breakdown. For this reason, the contact of the present invention shows electrical stability.

[Cu Alloy]

An additive element in the copper alloy applied to the liquid display device of the present invention will be described below. The additive element in the copper alloy applied to the gate wiring 33 and the gate electrode 351 in the TFT-LCD regarding the liquid display device of the present invention is a metal that has an oxide formation free energy with a negative value larger than that of Cu and a diffusion coefficient of the additive element in Cu (hereinafter referred to as a "diffusion coefficient" unless otherwise noted) larger than a self-diffusion coefficient of Cu.

By selecting the additive element of which the diffusion coefficient is larger than the self-diffusion coefficient of Cu, the additive element can reach the Cu surface faster to preferentially form an oxide film layer comprising the additive element on the Cu alloy surface.

In other words, if the diffusion coefficient of the additive element is smaller than the self-diffusion coefficient of Cu, the additive element requires a significant amount of time to reach the Cu alloy surface, and therefore a Cu oxide film layer consisting of CuO, $Cu_2O$, and the like is formed on the Cu alloy surface.

In this case, because the Cu oxide film layer is not robust, oxygen intrudes into the inside of the Cu oxide film layer and forms oxide of the additive element in the Cu alloy. In addition, an amount of Cu in a metal state decreases as the oxidation of Cu progresses, and if such Cu alloy is used for wiring of a liquid crystal display device, its electrical resistance would be increased.

Accordingly, the copper alloy applied to the present invention was intended to provide a solution to such a problem by the selection of the additive element of which the diffusion coefficient is larger than the self-diffusion coefficient of Cu.

The additive element in the copper alloy, which is applied to the present invention, is now described in detail. It is preferable that the additive element in the copper alloy forms a solid solution in an additive amount ranging from 0.1 to 25 atomic % in the Cu alloy. This is because the additive element cannot be easily diffused if it is not within the solid solution range in the Cu alloy. Especially, if the additive element forms an intermetallic compound with Cu, it is hardly diffused.

Also, if the additive amount of the additive element in the Cu alloy is lower than 0.1 atomic %, the oxidation of Cu cannot be prevented because the oxide film layer to be formed becomes thin. On the other hand, if the additive amount of the additive element exceeds 25 atomic %, the additive element is sometimes precipitated as a secondary phase.

Specifically, the additive element in the Cu alloy applied to the present invention is at least one of the elements selected from the group consisting of Mn, Zn, Ga, Li, Ge, Sr, Ag, In, Sn, Ba, Pr, and Nd. A single element may be used, or a plurality of additive elements may be applied together. Manganese (Mn) is especially preferable. Into the Cu alloy, an impurity such as S, Se, Te, Pb, or Si may be mixed in, however, this is acceptable as long as the characteristics of the Cu alloy, including electrical conductivity and tensile strength are not deteriorated.

In the present invention, a method for forming the Cu alloy is not particularly limited. That is, a plating method such as electric field plating or molten plating, or a physical vapor deposition method such as vacuum evaporation or sputtering may be used. The Cu alloy deposited by any of the methods is thermally treated to form an oxide film layer.

Temperature for the thermal treatment is, for example, 150 to 450° C., and a time period for the thermal treatment is, for example, in a range of 2 minutes to 5 hours. If the thermal treatment temperature is lower than 150° C., productivity is reduced because the formation of the oxide film is time-consuming. On the other hand, if it exceeds 450° C., it causes a problem that Cu is oxidized to form an oxide film before an additive element in the Cu alloy is diffused and reaches a surface. Also, if the thermal treatment time period is shorter than 2 minutes, thickness of the oxide film is too thin, while if it exceeds 5 hours, the formation of the oxide film is too time-consuming.

One example providing low resistivity in one of the copper alloys used in the present invention, CuMn, is now described. By the thermal treatment, CuMn constitutes wiring or an electrode, and an oxide film layer covering it. An example of a relationship between the thermal treatment time period (second) and resistivity ($\mu\Omega\cdot cm$) of the wiring body is shown in FIG. 21, using oxygen concentration (ppm) in a thermal atmosphere as a parameter.

Figure 21:
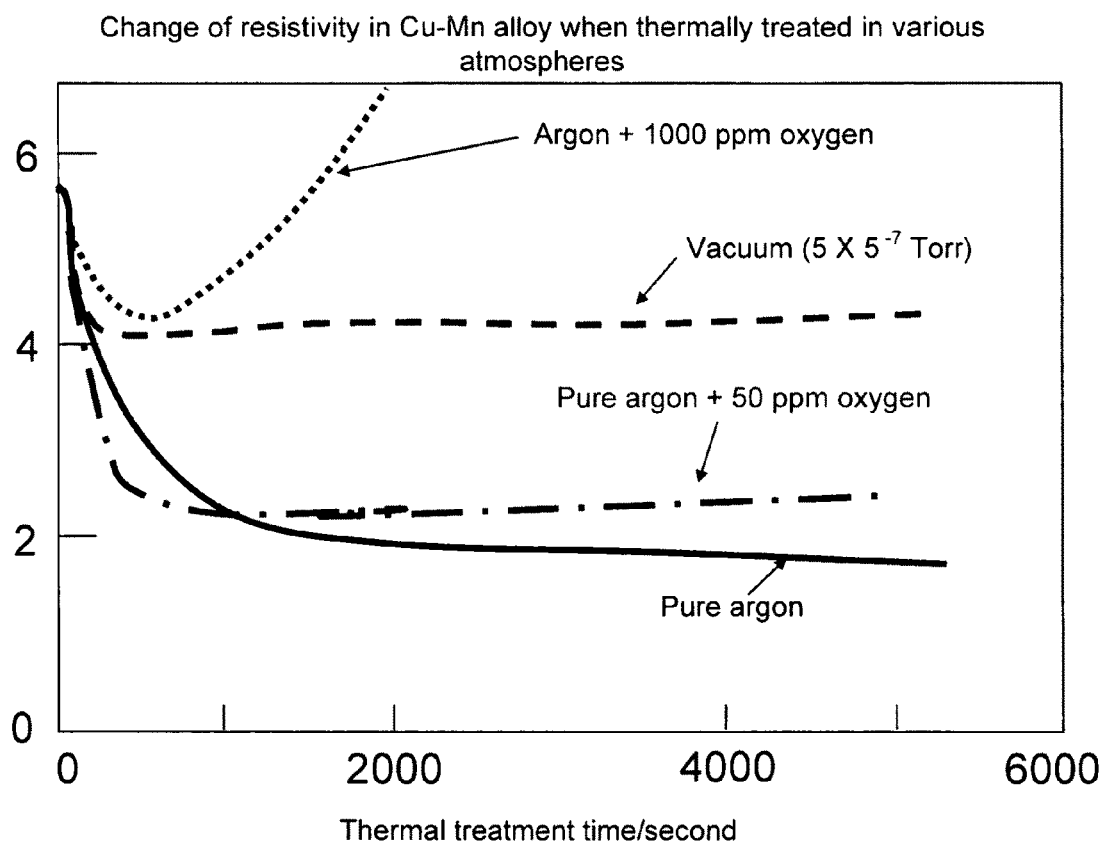
FIG. 21 is a graph illustrating electrical resistivity (1) of copper alloy (CuMn).

Measurements in FIG. 21 were carried out in such a way that Cu and Mn containing oxide was first formed also in a surface layer portion on the top side of the wiring body, then the oxide layer in the top surface layer portion was removed to expose the Cu wiring body, and the electrical resistivity of the Cu wiring body was measured. According to the result, the resistivity of the Cu wiring body was extremely low, and 2.2 $\mu\Omega\cdot cm$ under the conditions of an oxygen concentration of 50 ppm and a thermal treatment time period of 4 minutes. This value was close to an electrical resistivity of 1.7 $\mu\Omega\cdot cm$ of a pure Cu bulk material. That is, a satisfactory value to provide low resistive wiring and to promote an image quality improvement in a TFT-LCD was realized.

Because most of the Mn escapes from the thin film of CuMn by the thermal treatment and forms an oxide layer, thus the wiring body can realize the resistivity close to that of a pure copper.

Figure 22:
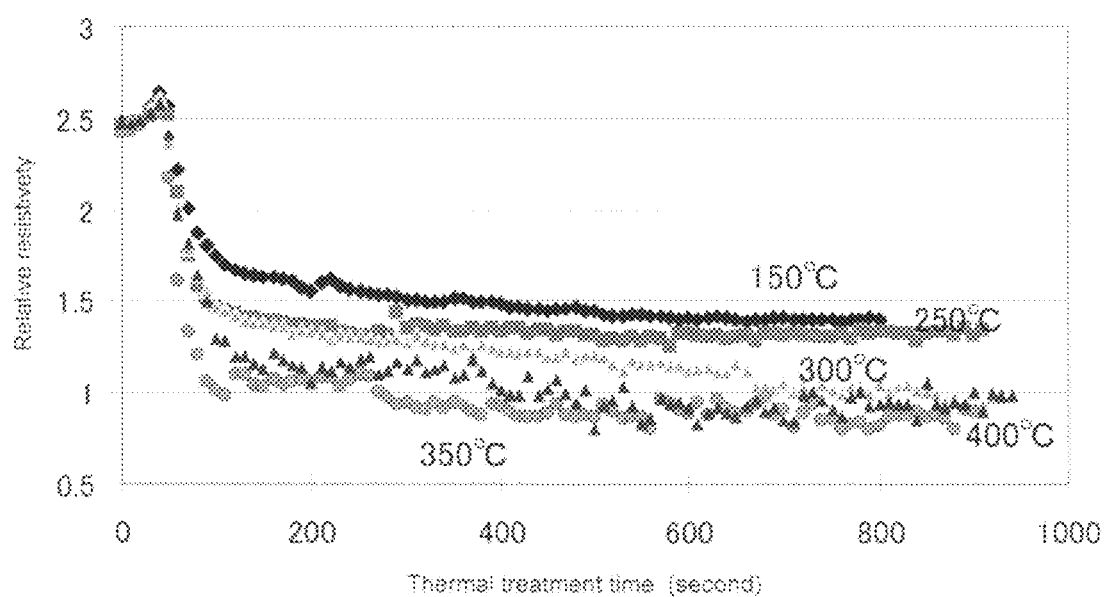
FIG. 22 is a graph illustrating electrical resistivity (2) of copper alloy (CuMn).

Similarly, FIG. 22 shows an example of relative resistivity against thermal treatment temperature using a thermal treatment time period as a parameter. It turns out that the resistivity is saturated to low resistivity at a thermal treatment temperature of 150 to 400° C. and a thermal treatment time period of approximately 2 minutes. The time period is short enough for processing time, and is an adequate value for manufacturing a TFT-LCD.

[Shading]

Among improvements of image quality obtained by lowering the wiring resistance, which are remarkable effects of the present invention, a shading reduction effect will be described below. First, an operation of a TFT-LCD is described in detail. A display device used in the present invention is an LCD in which pixels are arranged in a matrix form. This LCD is called an active matrix LCD (AM-LCD).

Figure 23:
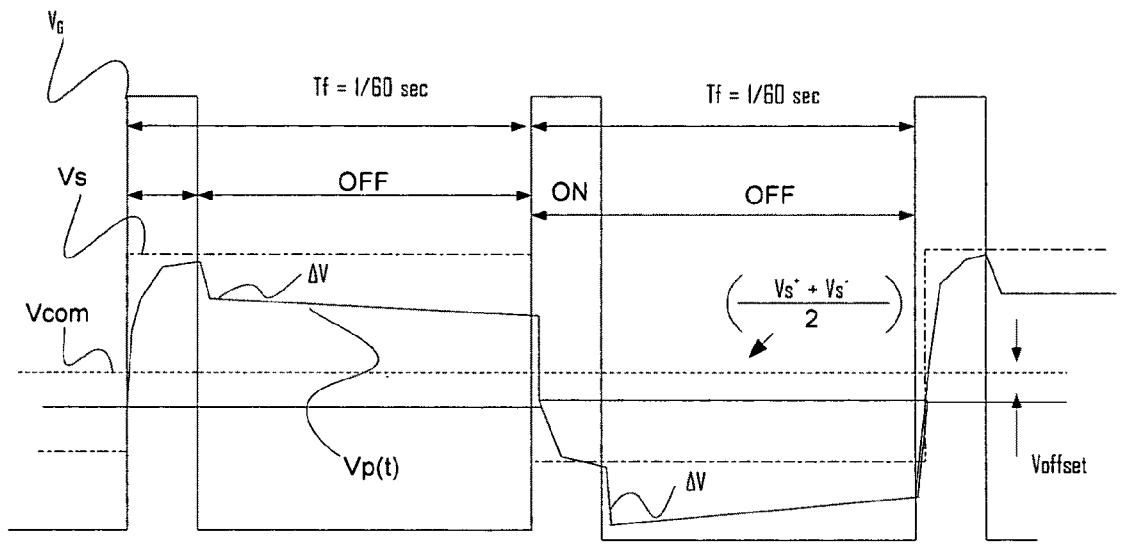
FIG. 23 is an operating waveform diagram of a TFT.

For example, in the case of a TFT-LCD for a digital TV, the number of pixels in a full HD specification is (1920×3)×1080. That is, the number of scanning lines is 1080, and the number of signal lines is 5760 because one pixel consists of three primary colors (red, green, and blue) and therefore the number of pixels in a horizontal direction is tripled. In this TFT-LCD, gate voltage $V_G$ shown in FIG. 23 is applied to a gate electrode of the TFT constituting the pixel. Typically, $V_G$ is 10 to 15 V.

On the other hand, signal voltage $V_S$ is applied to a source electrode, and a gate voltage pulse serves as a scanning signal.

Given that a frame frequency to display one screen is 60 Hz, a frame time is 16.7 ms. If the 1080 scanning lines are scanned in a line sequential scanning mode, a gate voltage pulse width becomes approximately 16 μs.

As illustrated in FIG. 23, a cycle of the gate voltage pulse is 16.7 ms, and the pulse width is approximately 16 μs. On the other hand, given that a LCD drive voltage $V_{lc}$ is approximately 5 V, the signal voltage applied to the source electrode to drive a liquid crystal is approximately 10 V that is a double of the voltage amplitude. A difference between the signal voltage and a common voltage $V_{com}$ applied to the common electrode provides a liquid crystal layer drive voltage $V_p(t)$, and FIG. 23 exemplifies a driving waveform in a frame inversion system in which a polarity of $V_p(t)$ is inverted for each frame to transform it into an alternating voltage.

In this case, transmittance of the LCD modulates brightness of the display by voltage modulation of the signal voltage. Further, the liquid crystal drive voltage is retained while the gate voltage pulse is off (approximately 16 ms that substantially corresponds to the frame time).

FIG. 23 illustrates such a situation. The liquid crystal layer drive voltage consists of a writing state and a holding state. Also, the transmittance of the LCD depends on a root-mean-square (r.m.s.) value of the liquid crystal layer drive voltage $V_p(t)$. For this reason, the LCD drive voltage $V_{lc}$ is expressed by the following equation 1:

$$<Vlc> \text{rms} = \frac{1}{2Tf}\sqrt{\int_{t=0}^{2Tf}\{Vp(+) - Vcom\}^2\, dt} \quad (1)$$

Meanwhile, a switching time of the a-Si TFT is of the order of μs because capacitance loads are driven and mobility of a-Si is as low as 0.3 to 1.0. Accordingly, a few μs is required for switching-on of the TFT during the gate voltage pulse width of 16.7 μs.

Further, because the liquid crystal layer is a capacitance load, an application of the signal voltage is delayed. As a result, rise of the liquid crystal layer drive voltage $V_p(t)$ is also delayed. In addition, in a TFT-LCD for TV with a full HD specification, 5760 pixels are arranged in one line. A plurality of TFTs arranged in one line are simultaneously excited by applying the gate voltage pulse to an end part of the gate wiring.

At this time, the gate voltage pulse is propagated from the end part to gate electrodes of respective pixels. A propagation speed decreases as a resistance value and parasitic electrical capacitance of the gate wiring are increased. This phenomenon is referred to as a propagation delay of the gate voltage pulse. As the propagation delay becomes larger, adequate time to input the liquid crystal layer drive voltage cannot be obtained, and therefore the liquid crystal drive voltage for each pixel cannot reach a predetermined value. As a result, the transmittance of the liquid crystal layer becomes uneven, i.e., the screen brightness becomes uneven, causing the shading. It should be appreciated that also in the above-described IPS liquid crystal and VA liquid crystal, it may cause the shading in the same manner.

Figure 24:
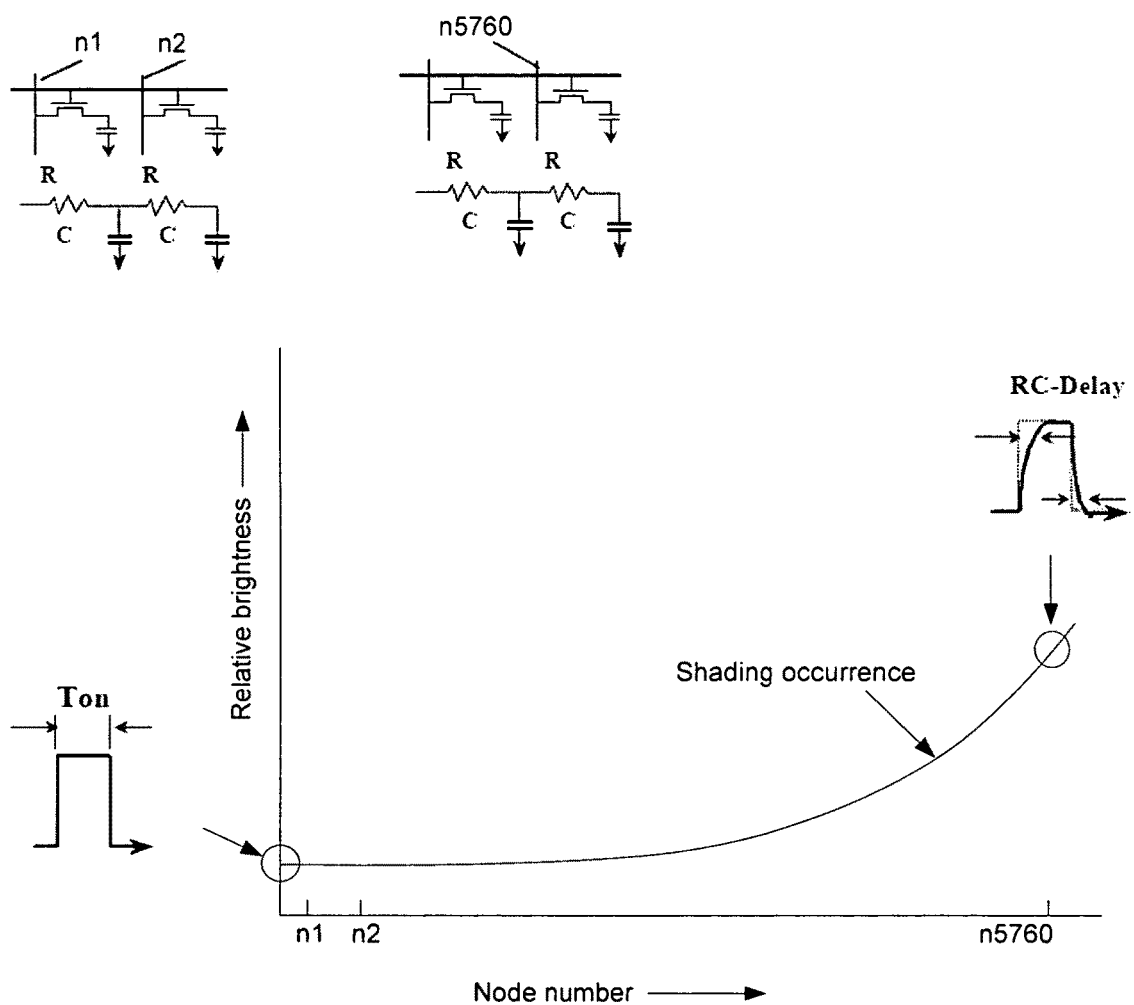
FIG. 24 is a diagram illustrating a model of a propagation delay of a gate voltage pulse.

A model of the propagation delay of the gate voltage pulse described above is shown in FIG. 24. Each pixel on the gate wiring can be equivalently expressed using resistance R and parasitic capacitance C. An RC delay of the gate voltage pulse in each column is accumulated, and at a terminal node n5760, the propagation delay reaches several μs.

If a distribution of the LCD brightness at this time is schematically illustrated, the brightness is gradually varied along the gate wiring in a normally white mode LCD, and at the terminal, the screen is bright instead of black as originally intended due to insufficient liquid crystal layer drive voltage. Therefore, the propagation delay of the gate voltage pulse is reduced by lowering the gate wiring resistance. Consequently, the unevenness in the screen brightness, in other words, the shading can be suppressed.

The present invention enables a reduction in such shading by using the above-described copper wiring close to pure copper, as illustrated in FIG. 14.

On the other hand, the number of nodes in the source wiring is 1080, and the problem of propagation delay is low compared to the gate wiring. However, as the size of a LCD panel increases, the value of propagation delay in the source wiring reaches a considerable amount, such as 1-3 μs, thus decreasing this propagation delay by applying CuMn alloy to the source wiring is effective for decreasing the unevenness in the LCD display brightness.

[Adhesiveness to Glass]

Adhesiveness to glass that is another remarkable effect of the present invention herein described. Thin film wiring and electrodes formed from the copper alloy CuMn are covered with the oxide layer formed by the thermal treatment.

In a liquid crystal display device, such wiring and electrodes are essentially required to have excellent adhesiveness to a glass substrate and the insulation layer. The adhesiveness is typically determined by performing a tape test. As shown in Table 1, if a pure Cu thin film is formed on an insulation film $SiO_2$, sufficient adhesiveness cannot be obtained, causing separation.

TABLE 1

Tape test results of Cu and Cu/Mn double layered film on an insulation film $SiO_2$

| Material (thickness: nm) | Thermal treatment temperature (° C.) | | | | | | |
|---|---|---|---|---|---|---|---|
| | 150° C. | 200° C. | 250° C. | 300° C. | 350° C. | 400° C. | 450° C. |
| Cu (150 nm) | X | X | X | X | X | X | X |
| Cu (150)/Mn (2) stacked layer | Δ | ○ | ○ | ○ | ○ | ○ | ○ |
| Cu (150)/Mn (20) stacked layer | Δ | ○ | ○ | ○ | ○ | ○ | ○ |

○: Good adhesiveness
X: Separation (poor adhesiveness)
Δ: Partial Separation

On the other hand, in a case of a double-layered thin film of Cu and Mn, interdiffusion of Cu and Si occurs at an interface between them by a thermal treatment, and an oxide layer having a composition of $Cu_X Mn_Y Si_Z O$ (0<X<Y, 0<Z<Y) is formed at the interface. This enables excellent adhesiveness to the insulation layer $SiO_2$ to be obtained.

As the tape test to evaluate the adhesiveness, a separation state was evaluated when a tape was peeled off after the tape had been stuck on a Cu thin film surface. Before the tape is peeled off, it is bonded onto the surface by pressing with a nail.

This procedure is repeated 10 times on a same position of the thin film to check the adhesiveness to a substrate. Results of the tape test were analyzed in detail.

According to the results, the CuMn double-layered thin film exhibited low electrical resistivity by being thermally treated at 200° C. or higher. On the other hand, regarding the adhesiveness, partial separation was observed when the film was thermally treated at 150° C. By a thermal treatment at 250° C., excellent adhesiveness was exhibited in all the thermal treatment time periods, which are 3 minutes, 30 minutes, 1 hour, 20 hours, and 100 hours. Similarly, excellent adhesiveness was obtained when the thermal treatment temperature was 350° C.

Figure 25:
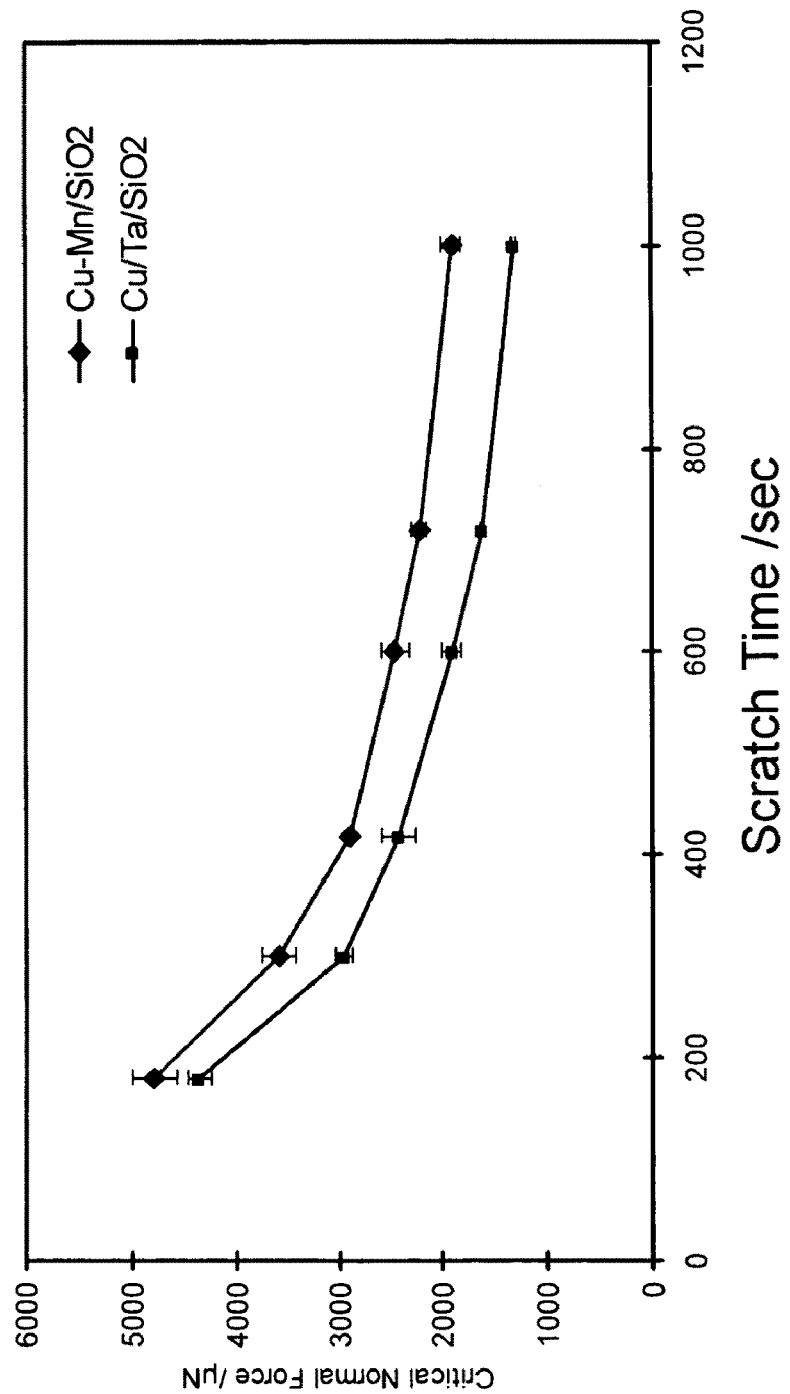
FIG. 25 is an example of adhesion strength measured by a nanoscratch test, compared with a case of forming Ta that is frequently used in semiconductor wiring.

FIG. 25 shows an interface adhesion strength in the case of thermally treated Cu-4atomic % Mn alloy at 400 degree/C for 30 minutes after forming in film on a SiO2 substrate, compared with a case of forming Ta (frequently used for semiconductor wiring), between pure Cu and SiO2. The adhesion strength is measured by a nano scratch method. A horizontal axis indicates a scratch time required to scan a length of 6 μm on the film surface. A smaller time corresponds to a faster scratch speed. At any scratch speed, the load value required for interface separation is larger in Cu—Mn/SiO2 compared to Cu/Ta/SiO2, showing a high adhesion strength.

Figure 26:
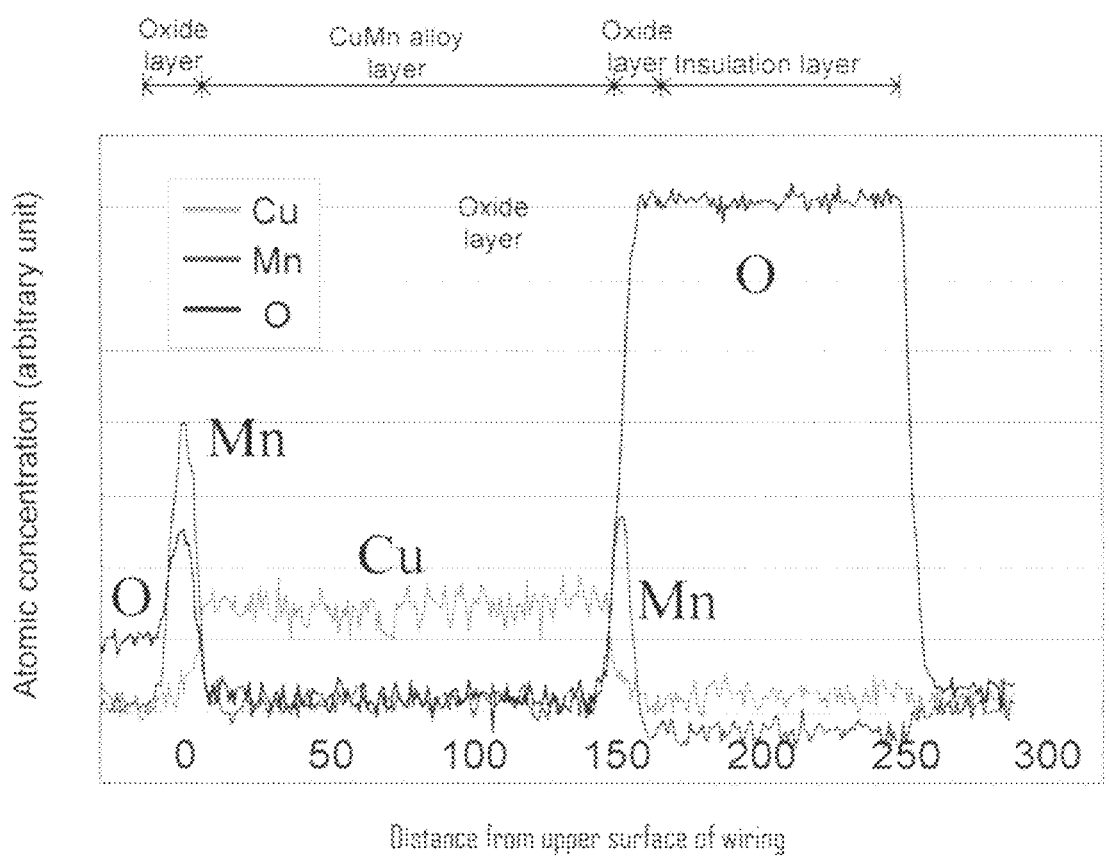
FIG. 26 is a composition diagram of a wiring structure.
Figure 27:
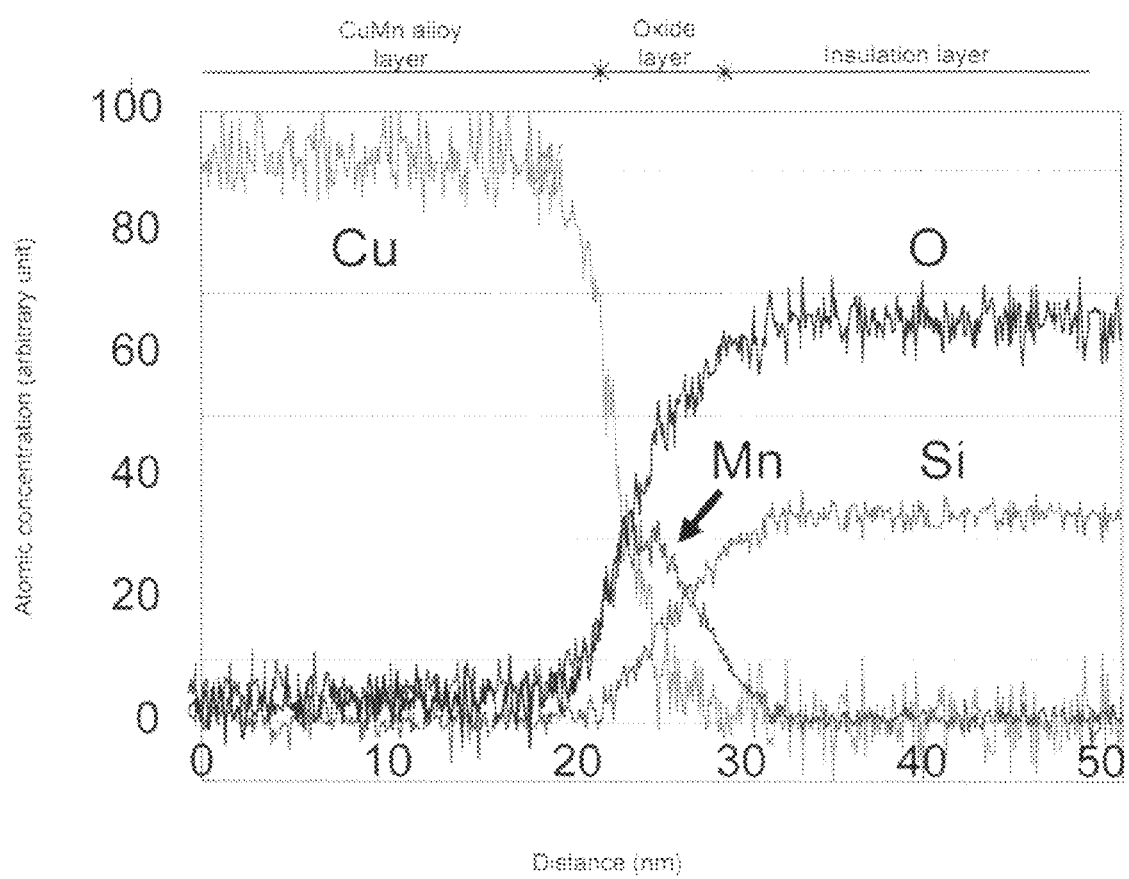
FIG. 27 is an enlarged view of a composition of a wiring structure across the interface between Cu and SiO2.

The oxide layer constituting the interface with the wiring and the electrodes on the insulation film $SiO_2$ has the composition of $Cu_XMn_YSi_ZO$ as shown in FIGS. 26 and 27, and is amorphous. As described, at the interface, the oxide layer containing mainly Mn acts as an excellent diffusion barrier to prevent interdiffusion between Cu wiring and the insulation layer. The gradual concentration change near the interface of the oxide layer promotes an excellent adhesion of the oxide layer with the Cu and with the Si. It can be considered that this provides the excellent adhesiveness.

This enables the oxide film with high adhesiveness to a substrate to be formed to prevent oxidation of a wiring material or the like, and a liquid crystal display device having wiring, an electrode, or a terminal electrode with high electrical conductivity and a manufacturing method therefore to be provided. All of such difficulties are simultaneously overcome, and the wiring, electrode, or terminal electrode applicable to a practical manufacturing process can be formed.

Figure 29:
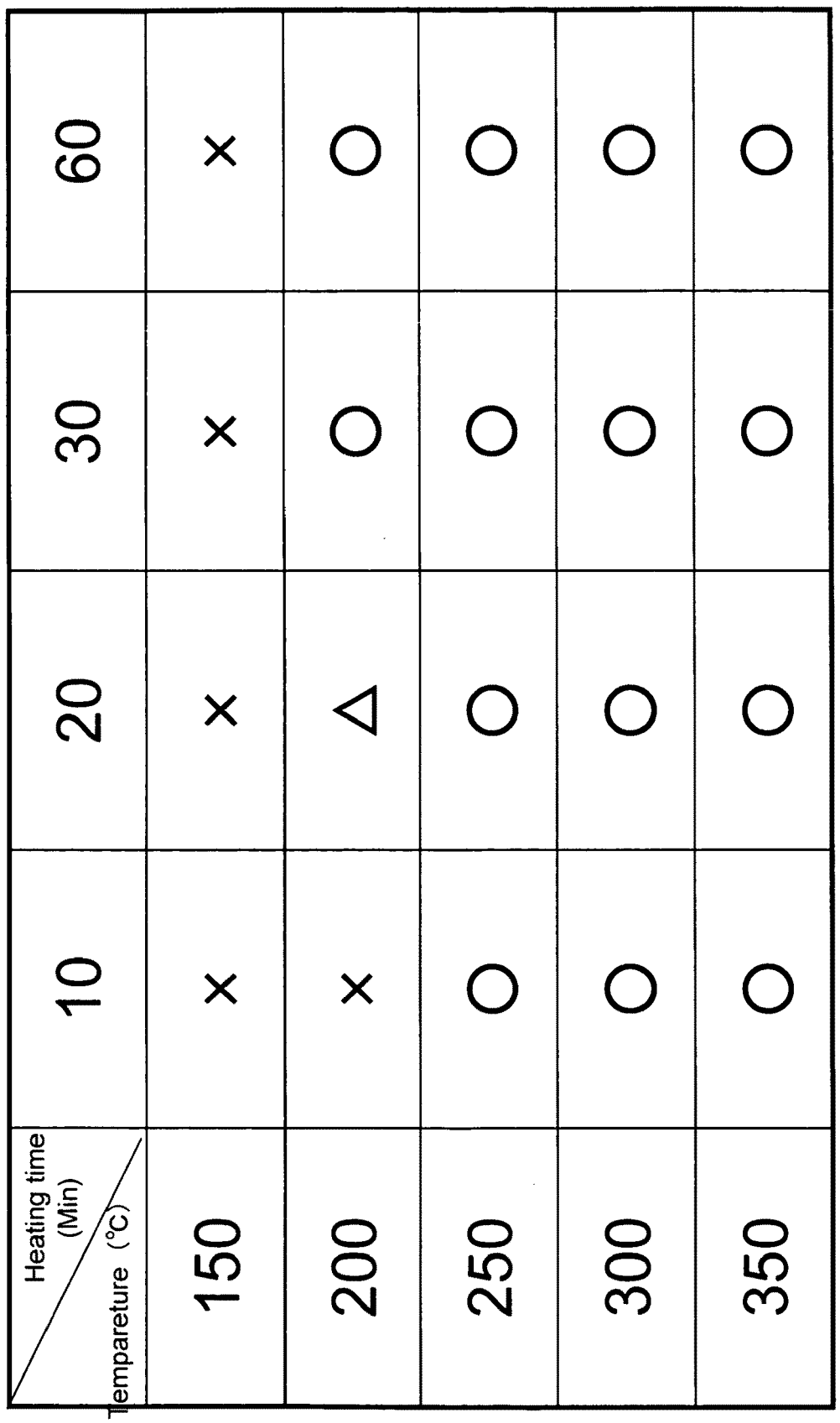
FIG. 29 is a result of an adhesiveness evaluation by tape test after thermally treating Cn—Mn alloy formed on a glass substrate at each temperature for a predetermined time.

In addition, Cu-4atomic % Mn alloy is formed in a film on the glass substrate using a spatter device in the current invention. Thereafter, the film is thermally treated in a pure argon atmosphere within a temperature range of 150-350 degree/C. The time required for the thermal treatment was 10 to 60 minutes. An evaluation (a tape test) is performed to find out whether the thin film strips off or not by peeling a piece of scotch tape adhered to the alloy thin film surface for both specimens with or without thermal treatment after forming a film. As a result, the alloy thin film without thermal treatment separated from the glass substrate. On the other hand, as shown in FIG. 29, when thermally treated for over 20 minutes in temperatures of 200 degree/C or above, or over 10 minutes in temperatures of 250 degree/C or above, the alloy thin film was adhered to the glass substrate. Similar tape tests have been done to pure Cu thin film, however, separation occurred to all heat treatment conditions. Based on this, it became apparent that favorable adhesiveness to a glass substrate was presented by thermally treating in a temperature of 200 degree/C or above using the Cu—Mn alloy.

Figure 28:
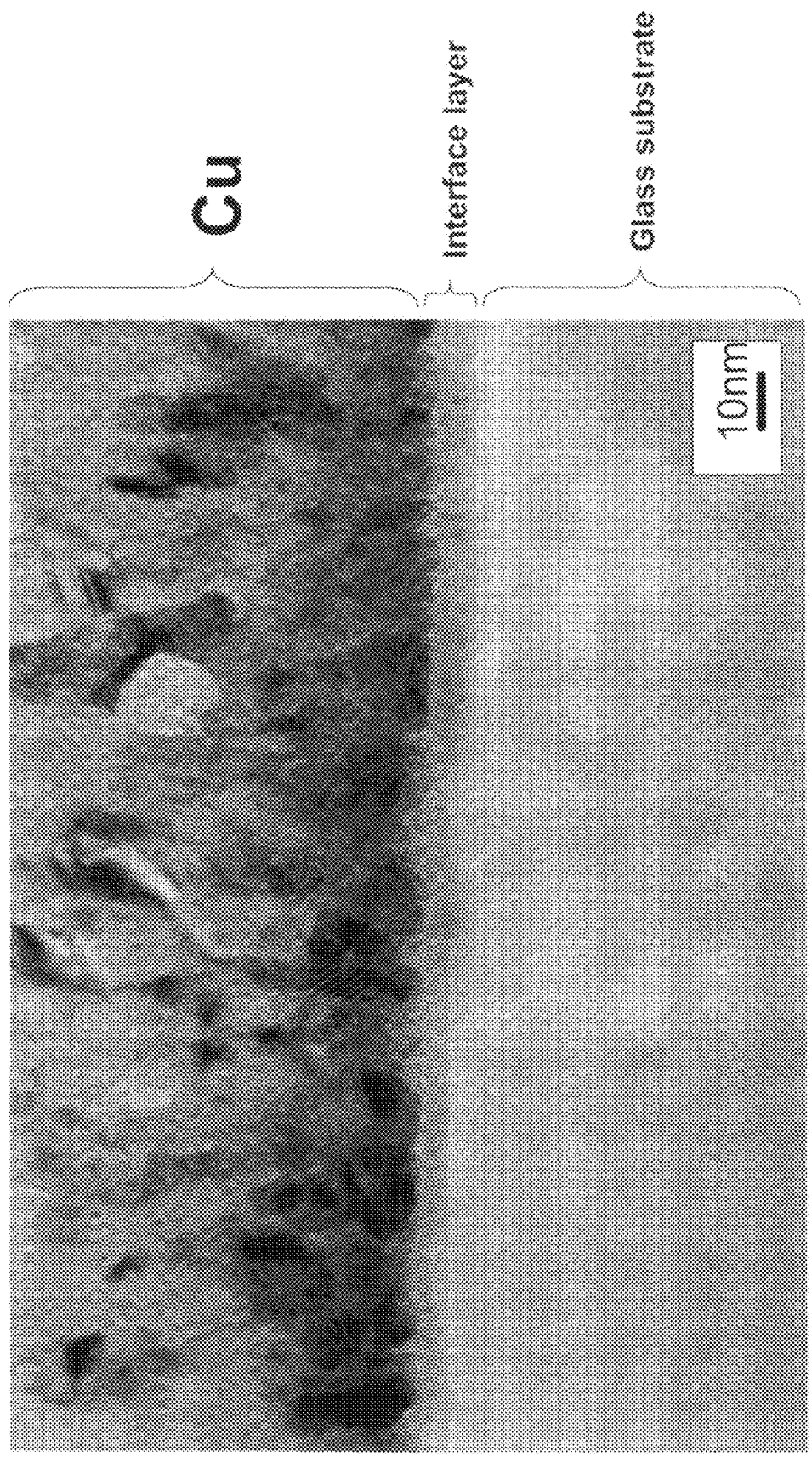
FIG. 28 is a cross-section TEM picture after thermally treating Cu—Mn alloy on the glass at 250° C. for 10 minutes.

FIG. 28 shows a cross-section TEM image after thermally treating the Cu—Mn alloy at 250° C. for 10 minutes. At the top of FIG. 28 is the Cu—Mn alloy thin film portion and at the bottom is the glass substrate. A reaction layer having an even contrast is observed along an interface of both layers. As a result of analysis using an X ray energy dispersive spectroscopy (XEDS) device attached to TEM, the reaction layer along the interface turned out to be an oxide mainly composed of Mn. Forming of this oxide is the reason for the improvement in adhesiveness of the interface.

In order to decrease resistivity, it is ideal to add only enough Mn to sufficiently form the interface layer. For example, when thermally treating 200 nm alloy film at 250 degree/C for 10 minutes, an interface layer with 6 nm thickness is formed. An amount of Mn contained in the interface layer is approximately 50%, which is equivalent to a pure Mn layer of approximately 3 nm in thickness. Therefore, a Mn concentration to be added to the alloy is Mn of 3 parts of 200 in volume ratio, thus Cu (1-2) atomic % Mn is ideal considering the density of Cu and Mn. When the thickness of the alloy film is 100 nm, twice the Mn concentration is required, and when the thickness of alloy film is 300 nm, 1.5 times the Mn concentration is required.

Also, FIG. 29 shows the result of adhesiveness evaluation by a tape test after thermally treating Cn—Mn alloy formed in film on a glass substrate at each temperature for a predetermine time. In this figure, X indicates separation occurred, Δ indicates separation occurred in some cases, O indicates separation did not occur at all. In addition, separation occurred for pure Cu in all conditions. Based on FIG. 29, no separation occurred for the present invention in a case of 250 degree/C or above.

Figure 30:
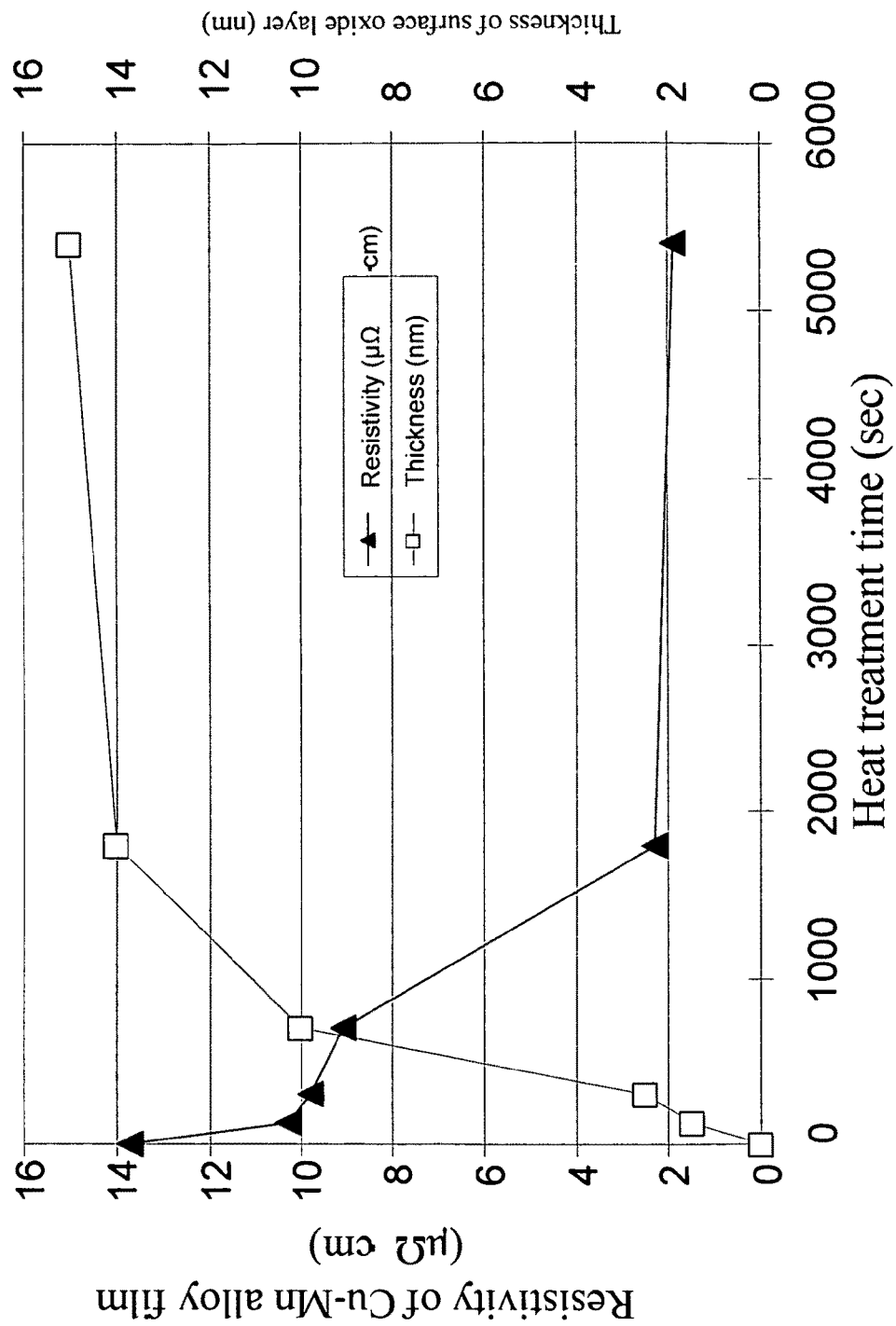
FIG. 30 shows resistivity of the alloy thin film that was thermally treated at 350° C., and a time change in thickness of a Mn oxide formed on the Cu surface.

In addition, in a case of an alloy with more than a sufficient amount of Mn is added to form an interface layer, heat treatment should be done in a high purity Ar gas (oxygen concentration of 0.1 ppm or below) atmosphere that contains oxygen as an inevitable impurity. FIG. 30 shows the resistivity of an alloy thin film on glass when thermally treated at 350 degree/C, and the time evolution of Mn-oxide thickness formed on the surface. As shown in FIG. 30, Mn remaining in the alloy film after forming an interface layer can be discharged from the alloy film by reacting with oxygen of less than 0.1 ppm contained in pure Ar and forming an oxide on the surface. As shown in FIG. 30, it became apparent that the resistivity decreases as the Mn oxide layer on the surface grows in thickness. Resistivity after 30 minutes of heat treatment decreases to a value equivalent to pure Cu thin film. XEDS analysis of the Mn concentration indicated no Mn in the alloy film, which revealed that excess Mn can be discharged from the alloy film completely.

[Manufacturing Process]

Regarding the liquid crystal display device according to the present invention, the oxide layer associated with the copper alloy used as a wiring and electrode material of a TFT-LCD, and a manufacturing process of the oxide layer are described below.

Figure 31:
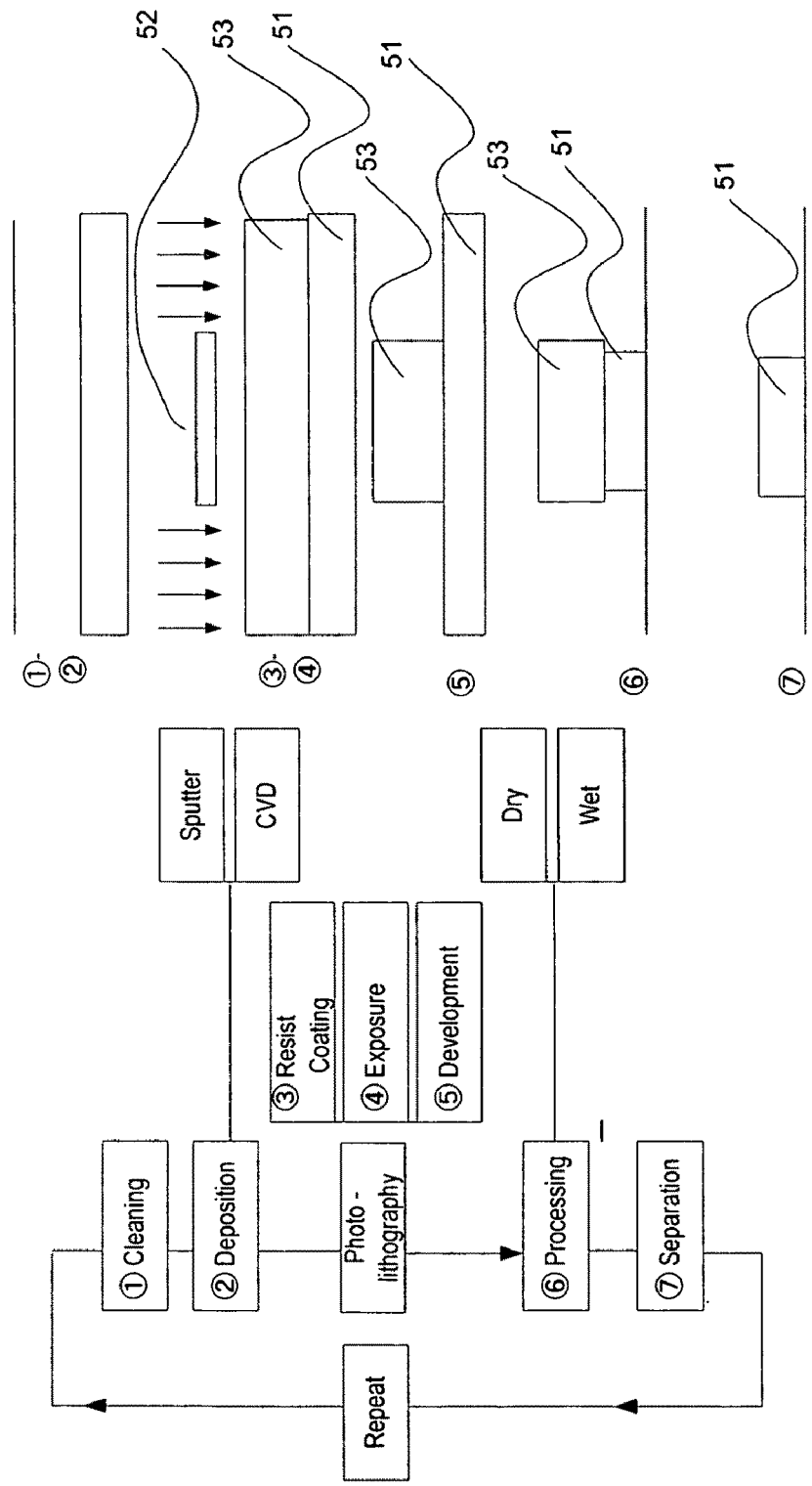
FIG. 31 is a diagram illustrating the fundamentals of a TFT manufacturing process.

FIG. 31 shows the fundamentals of a TFT manufacturing process. Thin films 51 of metal, semiconductor, and insulator are respectively deposited, and they are patterned by photoetching using mask 52 and resist coating 53. Sputtering is used for the metal film deposition, and CVD (Chemical Vapor Deposition) is used for the semiconductor and insulator depositions. For etching, either dry or wet etching is used. The wet etching is often used for the metal to form into the wiring. These steps are repeated four to five times to manufacture a TFT.

Figure 32:
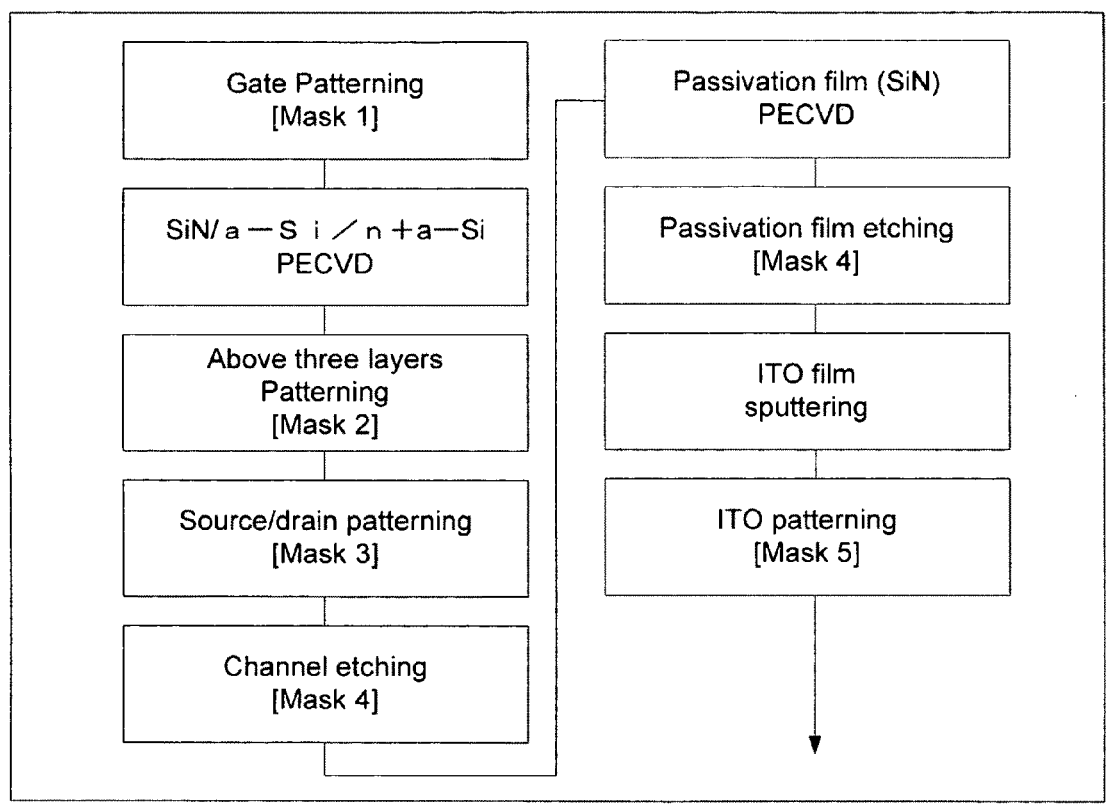
FIG. 32 is a diagram illustrating a five-mask process in TFT manufacturing.

Among them, FIG. 32 shows a five-mask process that uses five kinds of photomasks for exposure. The process sequence comprises the steps of: (1) forming a gate pattern by wet etching using a mask 1; (2) simultaneously processing three layers of SiN/a-Si/n⁺ a-Si by dry etching using a mask 2 to form a pattern; (3) forming a source/drain electrode pattern by wet etching using a mask 3; (4) fabricating the n⁺ a-Si layer into a channel structure by dry etching using the mask 3; (5) patterning the SiN passivation film using a mask 4; and (6) patterning an ITO (Indium Tin Oxide) film, which is a transparent electrode, using a mask 5. This allows a TFT substrate to be manufactured.

Figure 33:
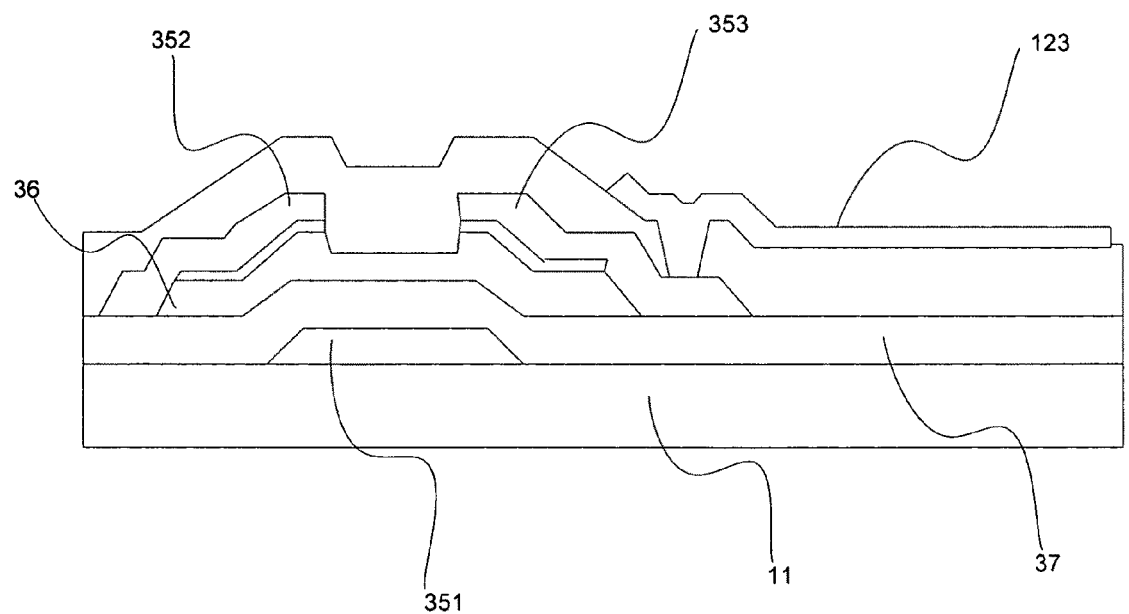
FIG. 33 is a cross-sectional view of a TFT manufactured by the five-mask process.
Figure 34:
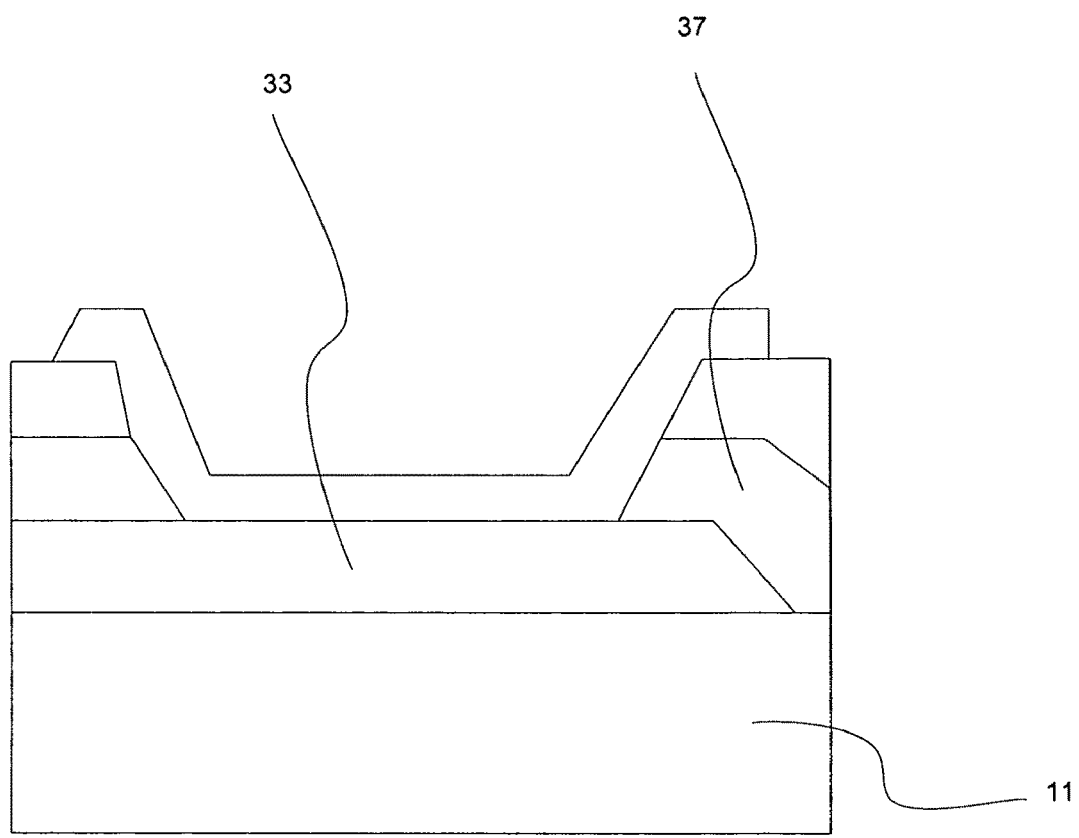
FIG. 34 is a cross-sectional view of an electrode led outside.
Figure 35:
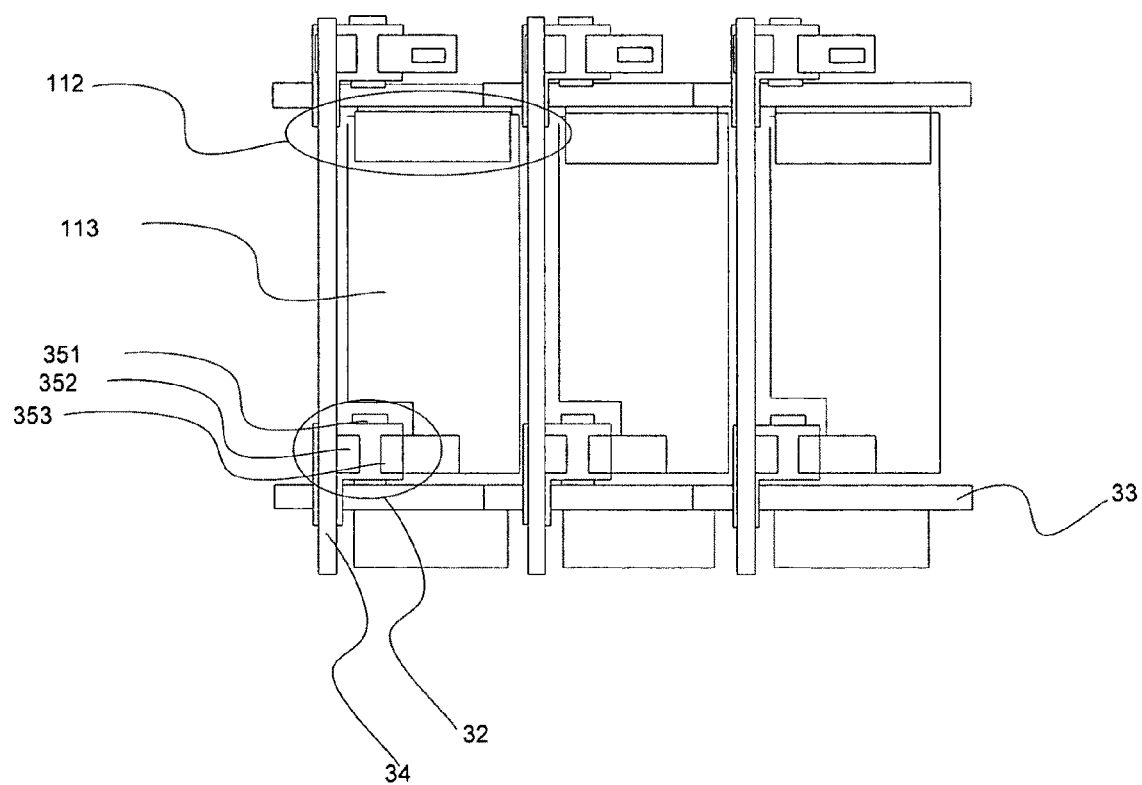
FIG. 35 is a plan view of a pixel part.

FIG. 33 shows a cross-section of a structure of a TFT manufactured by a standard five-mask process. As illustrated in FIG. 34, a gate terminal part constituting an external electrode has a stacked structure of a metal thin film and an ITO film. FIG. 35 shows a plan view of each pixel.

Selecting an additive element in the copper alloy according to the present invention such that the element has oxide formation free energy with a negative value larger than those of elements of an oxide layer enables an oxide film layer to be formed through reduction of the above-described oxide. Besides, in an oxidative atmosphere, the oxide film layer can be formed without the reduction of the oxide.

Further, if the Cu alloy applied as a wiring and electrode material in the TFT-LCD of the present invention is brought into contact with an insulation film containing oxygen, the additive element in the Cu alloy is diffused to the interface and thereby the additive element is oxidized to form the oxide film layer.

Still further, metal elements in the insulation layer, and Cu and the additive element in the Cu alloy form oxides respectively, and these oxides are combined together to form a compound oxide film. For example, if a TFT substrate contains oxide such as $SiO_2$, and gate wiring inside the Cu alloy provided on the substrate is thermally treated, the additive element in the Cu alloy forming the gate wiring is diffused to an interface between the substrate and the gate wiring and reacts with oxygen in the substrate to form into oxide, which forms an oxide film layer.

Also, for example, a gate insulation film 37 consisting of SiNO or the like is provided on a gate electrode 351, and by applying a thermal treatment in the manufacturing process, an oxide layer expressed by $(Cu, Si, \text{additive element})O_X$ is formed at an interface between the gate electrode 351 and the gate insulation film 37. In this way, the oxide layer can be provided on a surface of Cu alloy by using the Cu alloy as a wiring and electrode material for a TFT-LCD.

A method for manufacturing a liquid display device according to the present invention is provided. The manufacturing process of a TFT substrate 11 of the TFT-LCD according to the present invention comprises a step of depositing copper alloy on a substrate by physical evaporation or chemical vapor deposition, which mainly consists of Cu and forms an oxide layer of an additive element to said Cu on the Cu surface or at an interface with the substrate; and a step of photo-etching the obtained copper alloy film to form at least one of each wiring or each electrode.

In this case, the additive element in the above copper alloy is preferably at least one type of metal selected from the group consisting of Mn, Zn, Ga, Li, Ge, Sr, Ag, In, Sn, Ba, Pr, and Nd. Also in this case, a step of forming an oxide layer on a surface of at least one of the formed wiring or electrode may be included.

Also, an oxygen concentration in atmosphere gas used in the above-described oxide layer formation step is preferably an inert gas such as argon containing oxygen no less than 1 ppm and no more than 100 ppm. Alternatively, argon gas containing oxygen as an inevitable purity may also be used. Further, the oxide layer formation step may be a step of forming at least one of the wiring or electrode and then heating at 150 to 400° C. for 2 minutes to 50 hours to form an oxide layer of the additive element in the copper alloy on the surface of at least one of the wiring or electrode A thin film of an alloy was deposited on an insulation film $SiO_2$ using Cu-2 atomic % Mn alloy comprised of Cu with a purity of 99.9999% and Mn with a purity of 99.98% as a target material, and thermally treated at a temperature not less than 150° C. and not more than 450° C. Subsequently, a depth compositional profile was analyzed from a surface of the thin film using Auger electron spectroscopy.

Figure 36:
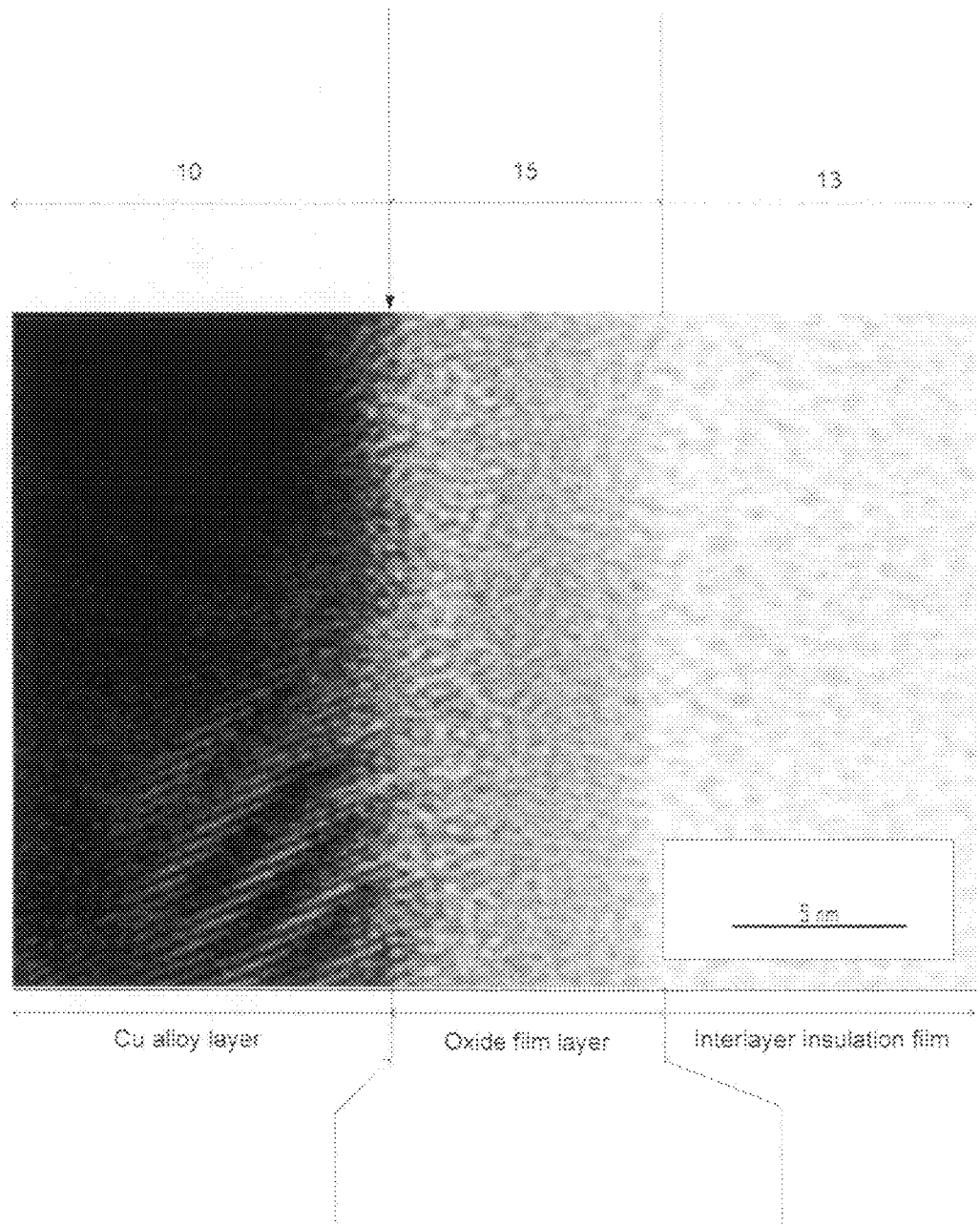
FIG. 36 is a cross-sectional photograph of an oxide film layer for wiring.
Figure 37:
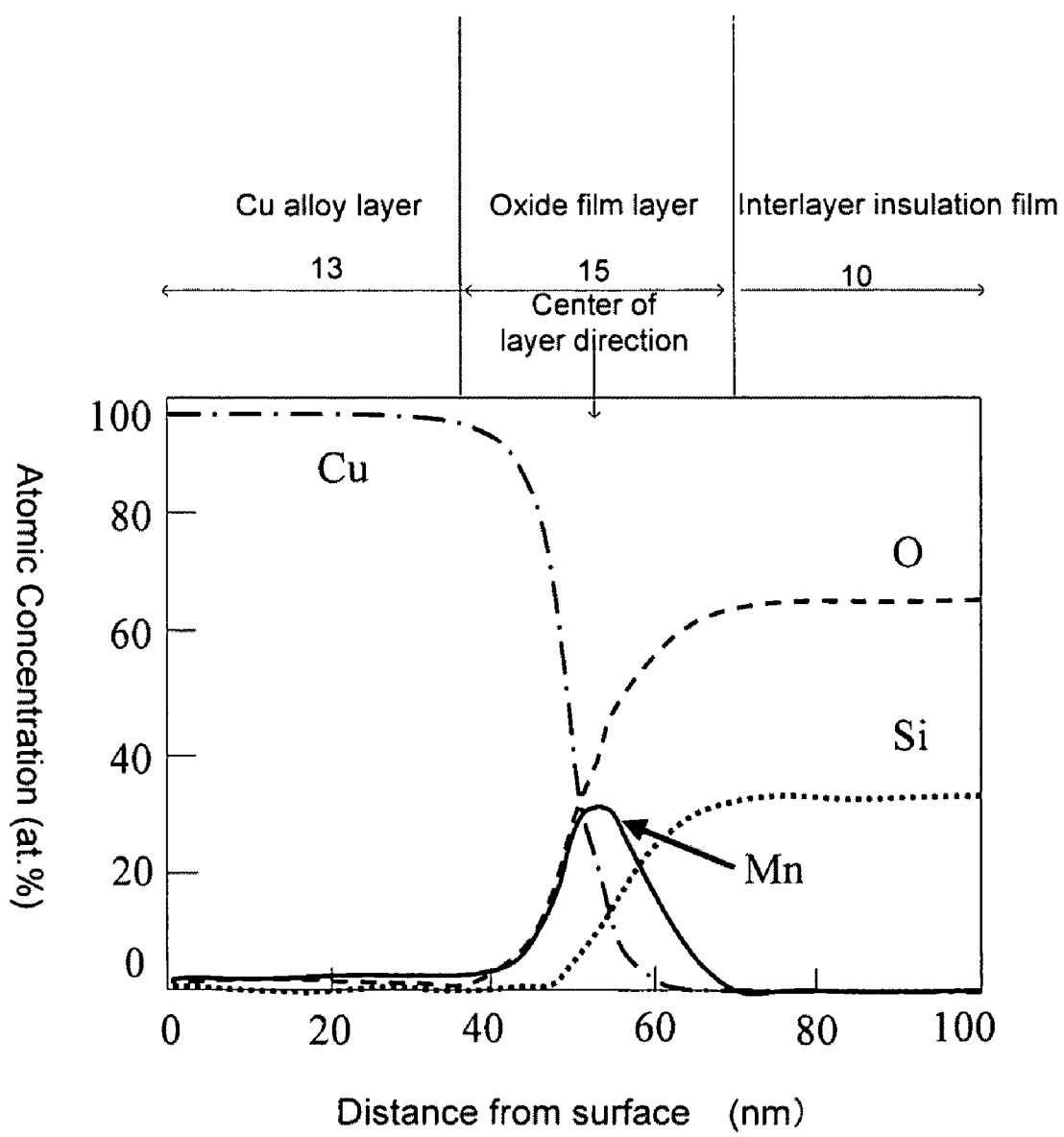
FIG. 37 is a diagram illustrating a composition of an oxide film layer for wiring.

Also, a cross-sectional sample was prepared, and a cross-sectional photograph thereof is shown in FIG. 36. Further, structural observation and compositional analysis were carried out using a transmission electron microscope and X-ray energy-loss spectroscopy (EELS). One example of the results is shown in FIG. 37. A stable oxide layer that contains Mn as a main element and has a thickness of a few nm to 20-odd nm is formed around an interface between the Cu—Mn alloy and the insulating substrate and around a surface of the Cu—Mn alloy.

Figure 38:
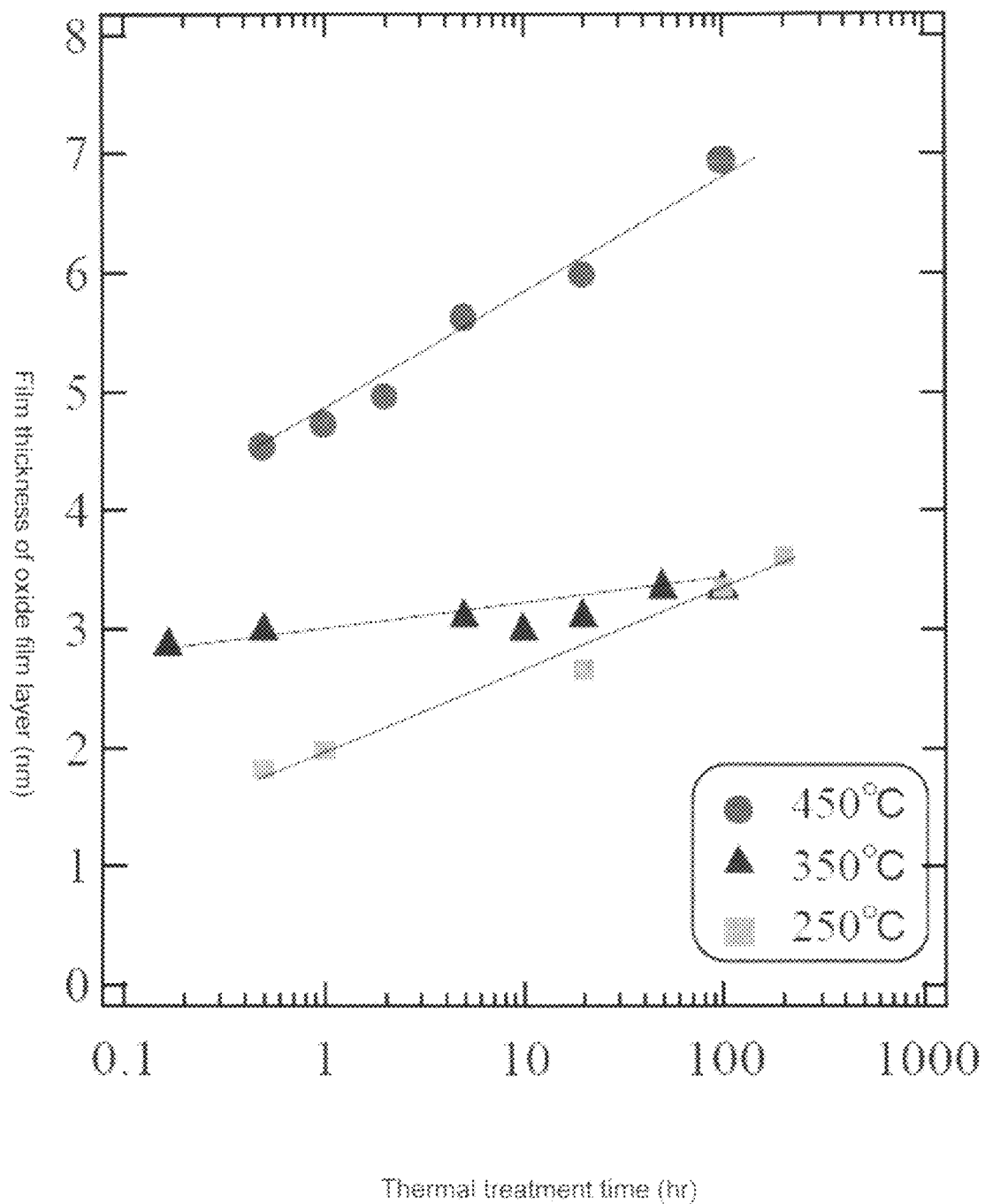
FIG. 38 is a film thickness of an oxide layer.

FIG. 38 shows a variation in film thickness of the oxide layer against a thermal treatment time period. Table 2 shows a film thickness of the obtained oxide layer against Mn atomic concentration in the CuMn alloy, a thermal treatment time period, and thermal treatment temperature. FIGS. 26 and 27 shows an enlarged view of a compositional distribution of the oxide layer. The distribution in which Mn has a peak around a center of the oxide film is exhibited. Cu intrudes from the wiring body to the oxide layer; however, the Cu intrusion into the insulation film is prevented.

TABLE 2

| Thickness of formed oxide film layer | | | |
|---|---|---|---|
| Atomic concentration in CuMn alloy | Thermal treatment | Thermal treatment tempareture (° C.) | |
| (at · %) | time (minute) | 350° C. | 450° C. |
| 10% | 20 min | 3.2 nm | 6.1 nm |
| 20% | 30 min | — | 8.2 nm |

Requirements for a sputtering target are provided in the case where CuMn is used as the copper alloy in the liquid crystal display device of the present invention. In a TFT-LCD of the present invention, a propagation delay in gate wiring is particularly large. In order to reduce the delay, it is preferable to use copper wiring to provide wiring having low resistance close to that of pure copper, as described above.

Figure 39:
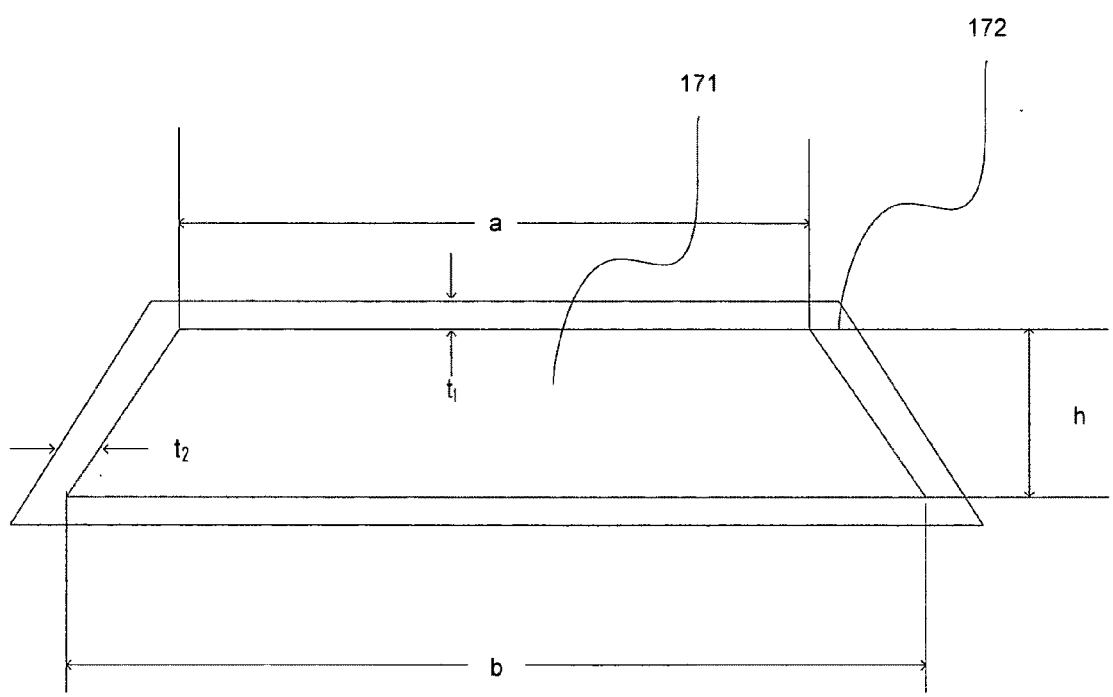
FIG. 39 is diagram of a cross-sectional model of a wiring structure according to the present invention.

FIG. 39 shows a cross-sectional view of gate wring using CuMn. The gate wiring is comprised of a wiring body 171 and an oxide film layer 172. Parameters a, b, h, $t_1$, and $t_2$ in FIG. 39 represents sizes of respective parts. a and b are a few μm to 10-odd μm, and h is 200 to 500 nm. $t_1$ and $t_2$ are 2 to 10 nm. In this case, in order for the wiring body 171 to provide low resistivity close to that of pure copper, an amount of Mn corresponding to that contained in the oxide film layer 172 formed by a thermal treatment is preferably contained in the wiring body 171, CuMn, before the thermal treatment. Accordingly, a content of Mn that is an additive element contained in the sputtering target is provided.

[Organic EL]

Figure 40:
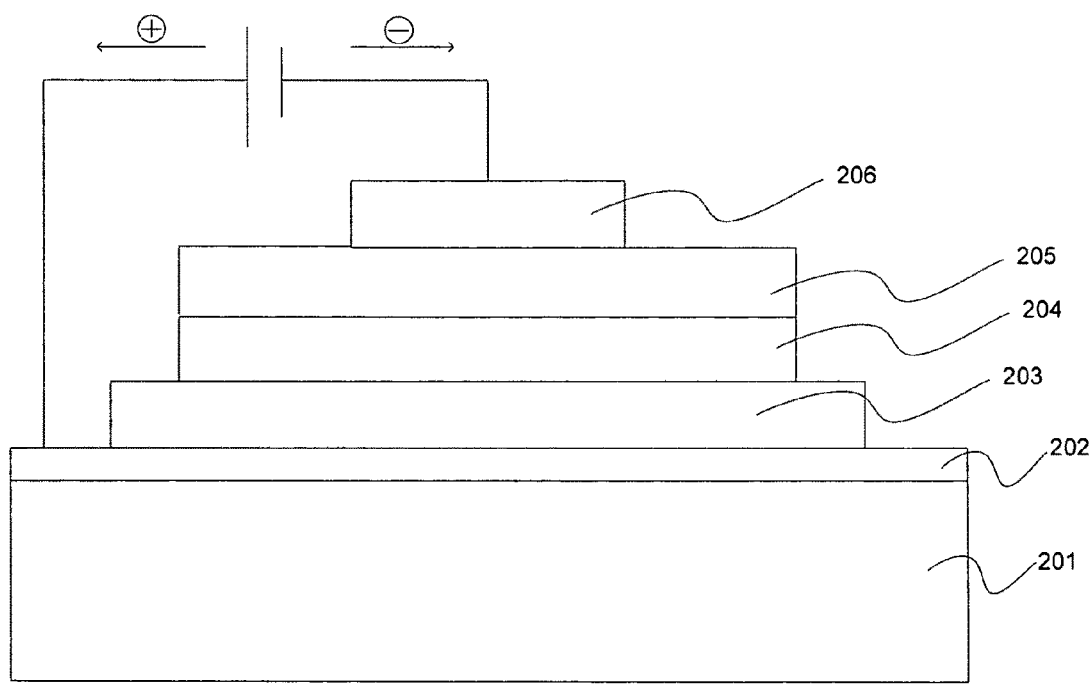
FIG. 40 is one example of a cross-section of an organic EL element.

The present invention is not limited to a TFT liquid crystal display device, but applicable to an organic EL display device. One example of organic EL according to the present invention is illustrated in FIG. 40. It is mainly comprised of a glass substrate 201; an anode (ITO) 202, a hole transport layer (HTL) 203, an emission layer (EML) 204, and an electron transport layer (ETL) 205, which are sequentially stacked on the glass substrate 201; and a cathode 206 arranged on the electron transport layer 205. For the emission layer, an organic matter such as a diamine system is used. The anode 202 and the cathode 206 are electrically connected to each other with an electrode line through a power supply. Each of the layers has a thickness of, for example, approximately a few tens of nanometers (nm).

The organic EL display device comprises a scanning line 194, a signal line 195, and a power line 196, which intersect with one another in a matrix form on the substrate 181, and a pixel area 198 surrounded by the scanning line 194, the signal line 195, and the power line 196, and as one example, the pixel area 198 has an organic EL element 191, a driving TFT 192, and a switching TFT 193.

The organic EL comprises the anode, the hole transport layer, the organic emission layer, the electron transport layer, and the cathode, which are stacked on the glass substrate. One pixel is comprised of a TFT circuit and the organic EL element, and a plurality of pixels are arranged in a matrix form, which is a so-called active matrix organic EL display device.

Figure 41:
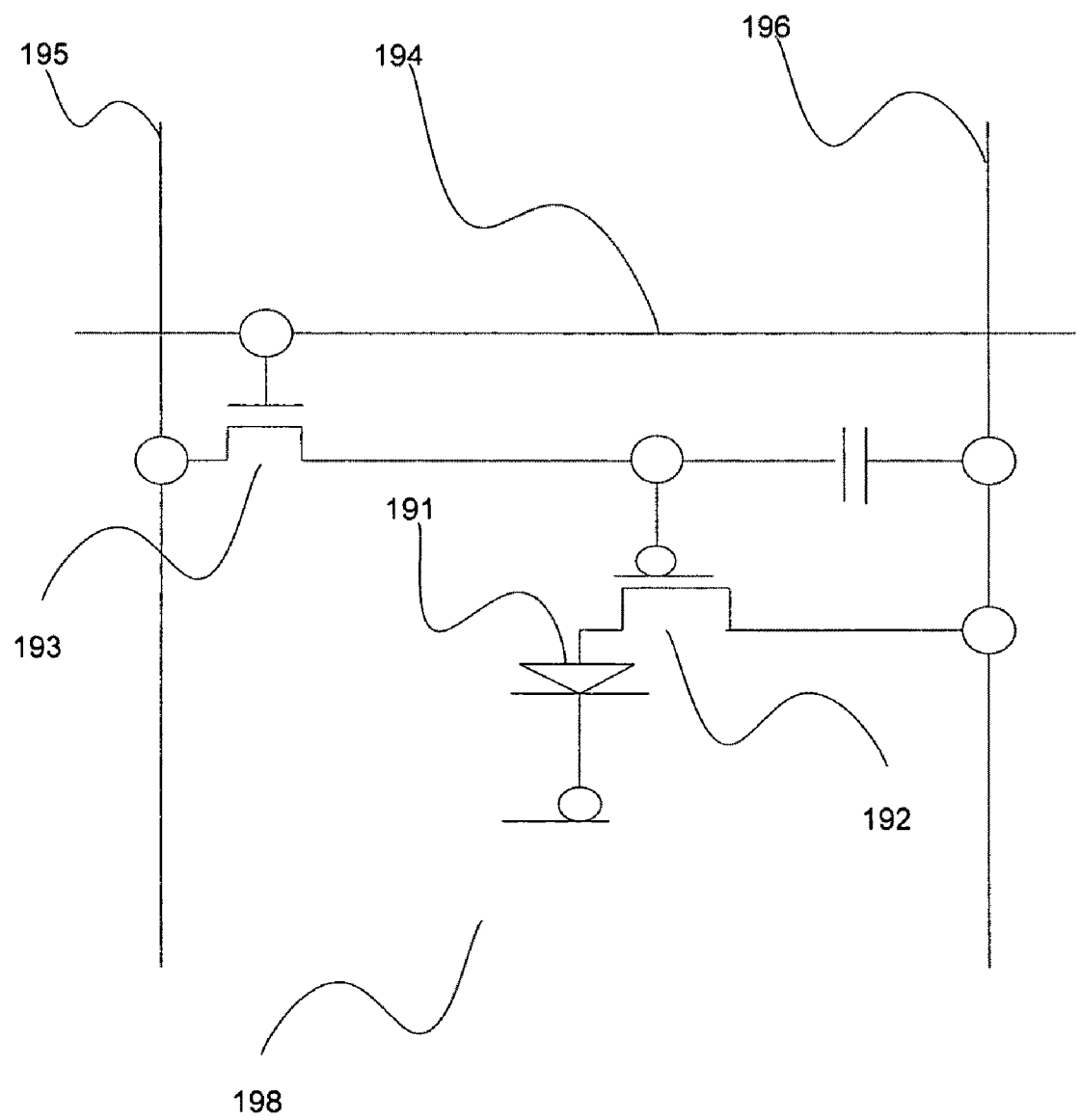
FIG. 41 is one example of an equivalent circuit diagram of a pixel in an organic EL display.
Figure 42:
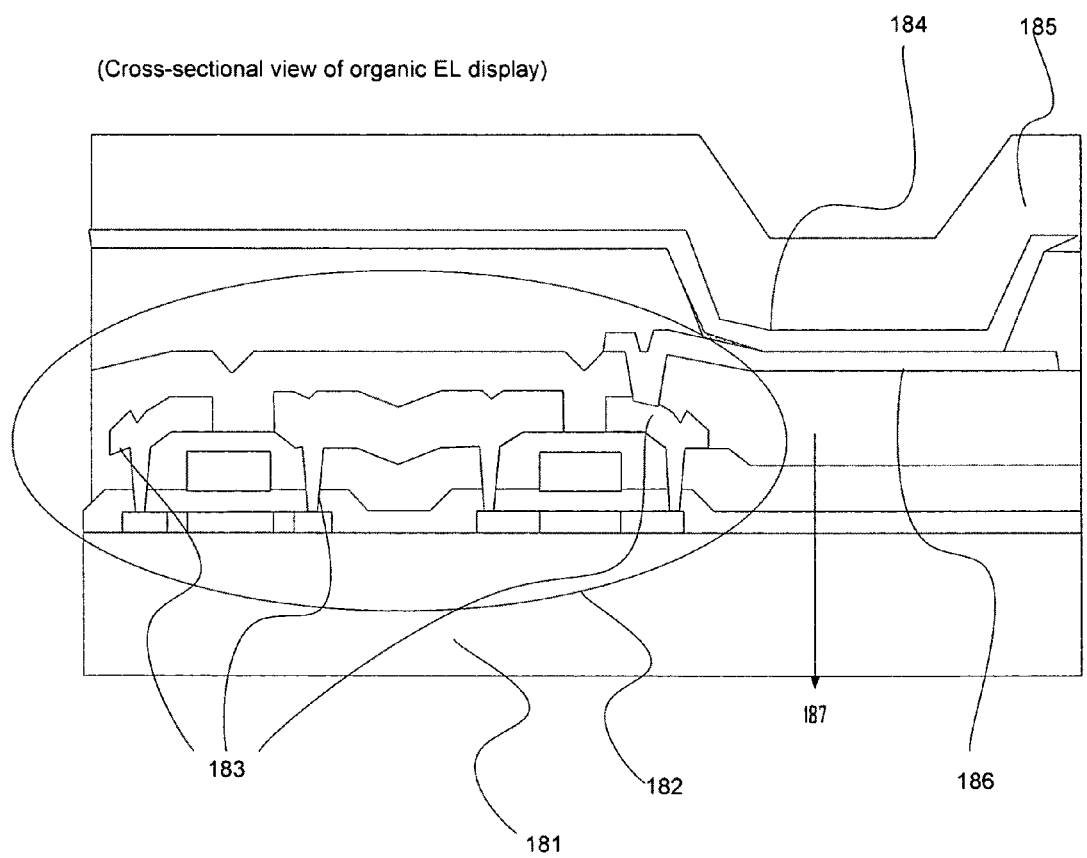
FIG. 42 is one example of a cross-section of an organic EL display.

An equivalent circuit of one pixel is shown in FIG. 41. Also, FIG. 42 shows a cross-sectional view of the pixel. For example, on a glass substrate 181, there are a driving TFT part 182 and an organic EL element 184, in which electrodes 183 for a TFT, a cathode 185 made of metal, and a transparent electrode 186 are present, and in this example, light 187 is emitted toward a lower part of the substrate.

In the active matrix organic EL display device, unevenness of an image caused by a propagation delay of a gate voltage pulse generated in an active matrix liquid crystal display device occurs. To deal with it, copper alloy is used as a wiring material having high conductivity.

The copper alloy of the present invention is useful for a scanning line and a signal line. In the organic EL display device according to the present invention, at least one of the scanning line, the signal line, the power line, or the TFT electrode uses copper as a main component, and consists of copper alloy that forms an oxide layer of an additive element to Cu, which covers wiring or the electrode. A cross-section of the wiring is a structure such as FIG. 39.

Further, regarding the copper alloy, copper alloy in which an additive element is diffused to a surface of the copper alloy to form an oxide film layer of the additive element may be used. Still further, the additive element may be at least one type of metal selected from the group consisting of Mn, Zn, Ga, Li, Ge, Sr, Ag, In, Sn, Ba, Pr, and Nd. Still further, the additive element is preferably Mn.

Further, the configuration of the external extraction electrode terminal is preferable to be those of FIGS. 10, 11, 12, 13, and 14.

What is claimed is:

1. A liquid crystal display (LCD) device, comprising:
    a glass substrate having a Thin Film Transistor (TFT)-LCD panel region and a peripheral region that is adjacent to the TFT-LCD panel region;
    an electrode terminal formed on the glass substrate in the peripheral region, with the electrode terminal connected to the TFT-LCD panel, the electrode terminal comprising a layer comprising copper and an oxide layer covering the layer comprising Copper (Cu), with the oxide layer comprising Manganese (Mn) and Copper (Cu); and
    a substantially transparent electrode formed on the electrode terminal.

2. The liquid crystal display device according to claim 1, wherein the electrode terminal and the substantially transparent electrode has an ohmic contact.

3. The liquid crystal display device according to claim 1, wherein the electrode terminal is directly formed on the glass substrate.

4. The liquid crystal display device according to claim 1, wherein the oxide layer has a compositional formula of $Cu_xMn_ySi_zO$ ($0<X<Y$, $0<Z<Y$).

5. The liquid crystal display device according to claim 1, wherein the electrode terminal formed on the glass substrate is covered by a protective film, and the substantially transparent electrode contacts the oxide layer through an aperture in the protective film.

6. The liquid crystal display device according to claim 1, wherein the layer comprising Copper (Cu) is formed from a copper alloy, and an additive element in the copper alloy is Manganese (Mn).

7. The liquid crystal display device according to claim 6, wherein an additive amount of the Manganese (Mn) is in a range of 0.5 to 25 atomic %.

8. The liquid crystal display device according to claim 1, wherein the oxide layer further contains Silicon (Si).

9. A liquid crystal display (LCD) device, comprising:
    a glass substrate;
    an electrode terminal formed on the glass substrate, the electrode terminal connected to a Thin Film Transistor (TFT), the electrode terminal comprising a layer comprising Copper (Cu) and an oxide layer covering the layer comprising Copper (Cu); and
    a substantially transparent electrode formed on the electrode terminal, with the substantially transparent electrode having an ohmic contact with the electrode terminal.

10. The liquid crystal display device according to claim 9, wherein the oxide layer comprises Manganese (Mn) and Copper (Cu).

11. The liquid crystal display device according to claim 9, wherein the electrode terminal is directly formed on the glass substrate.

12. The liquid crystal display device according to claim 9, wherein the oxide layer has a compositional formula of $Cu_xMn_ySi_zO$ ($0<X<Y$, $0<Z<Y$).

13. The liquid crystal display device according to claim 9, wherein the electrode terminal formed on the glass substrate is covered by a protective film, and the substantially transparent electrode contacts the oxide layer through an aperture in the protective film.

14. The liquid crystal display device according to claim 9, wherein the layer comprising Copper (Cu) is formed from a copper alloy, and an additive element in the copper alloy is Manganese (Mn).

15. The liquid crystal display device according to claim 14, wherein an additive amount of the Manganese (Mn) is in a range of 0.5 to 25 atomic %.

16. The liquid crystal display device according to claim 9, wherein the oxide layer contains Manganese (Mn) and Silicon (Si).

* * * * *